US008067813B2

(12) United States Patent
Wright

(10) Patent No.: US 8,067,813 B2
(45) Date of Patent: Nov. 29, 2011

(54) INTEGRATED MIS PHOTOSENSITIVE DEVICE USING CONTINUOUS FILMS

(75) Inventor: Michael Dean Wright, Palo Alto, CA (US)

(73) Assignee: Varian Medical Systems Technologies, Inc., Palo Alto, CA (US)

(*) Notice: Subject to any disclaimer, the term of this patent is extended or adjusted under 35 U.S.C. 154(b) by 33 days.

(21) Appl. No.: 11/687,495

(22) Filed: Mar. 16, 2007

(65) Prior Publication Data

US 2007/0164333 A1 Jul. 19, 2007

Related U.S. Application Data

(63) Continuation-in-part of application No. 10/882,603, filed on Jul. 1, 2004, now Pat. No. 7,208,810.

(51) Int. Cl.
*H01L 27/146* (2006.01)
(52) U.S. Cl. ........................................ 257/444; 257/459
(58) Field of Classification Search ................. 257/444, 257/292, 459, E27.133
See application file for complete search history.

(56) References Cited

U.S. PATENT DOCUMENTS

| 4,435,610 | A | | 3/1984 | Perlman et al. |
|---|---|---|---|---|
| 5,610,403 | A | * | 3/1997 | Kingsley et al. ......... 250/370.09 |
| 6,075,256 | A | | 6/2000 | Kaifu et al. |
| 6,242,746 | B1 | * | 6/2001 | Teranuma et al. ....... 250/370.13 |
| 6,271,880 | B1 | | 8/2001 | Kameshima et al. |
| 6,340,818 | B1 | * | 1/2002 | Izumi et al. .............. 250/370.13 |
| 6,512,217 | B1 | | 1/2003 | Kameshima |
| 6,512,279 | B2 | | 1/2003 | Kaifu et al. |
| 6,682,960 | B1 | | 1/2004 | Mochizuki |
| 6,710,370 | B2 | | 3/2004 | Street et al. |
| 6,816,355 | B2 | | 11/2004 | Watanabe |
| 2001/0050402 | A1 | | 12/2001 | Kaifu et al. |
| 2003/0127647 | A1 | | 7/2003 | Street et al. |
| 2003/0226974 | A1 | | 12/2003 | Nomura et al. |
| 2004/0041097 | A1 | | 3/2004 | Ishii et al. |
| 2004/0101100 | A1 | * | 5/2004 | Morii et al. .................. 378/98.7 |
| 2006/0001120 | A1 | | 1/2006 | Wright |

FOREIGN PATENT DOCUMENTS

| EP | 1326278 A2 | | 7/2003 |
|---|---|---|---|
| EP | 1 388 740 A2 | | 2/2004 |
| JP | 2002-233956 | * | 8/2002 |

OTHER PUBLICATIONS

International Search Report for PCT/US08/52260, dated May 23, 2008, 3 pages.
Written Opinion for PCT/US08/52260, dated May 23, 2008, 7 pages.
Kameshima, T., Kaifu, N., Takami, E., Morishita, M., and Yamazaki, T., "Novel Large Area MIS-type X-ray Image Sensor for Digital Radiography," SPIE Conference on Physics of Medical Imaging, SPIE vol. 3336, pp. 453-462, Feb. 1998.
Mulato, M., Ready, S., Van Schuylenbergh, K., Lu, J.P., and Street, R.A., "Crosstalk and Lateral Conduction Effects in Continuous-Sensor Amorphous Silicon Imagers," Journal of Applied Physics, vol. 89, No. 12, pp. 8193-8201, Jun. 2001.

(Continued)

*Primary Examiner* — Bradley K Smith
(74) *Attorney, Agent, or Firm* — Vedder Price, P.C.

(57) ABSTRACT

An integrated photosensitive device with a metal-insulator-semiconductor (MIS) photodiode constructed with one or more substantially continuous layers of semiconductor material and with a substantially continuous layer of dielectric material.

34 Claims, 17 Drawing Sheets

OTHER PUBLICATIONS

Mulato, M., Lemmi, F., Lau, R., Lu, J.P., Ho, J., Ready, S,E., Rahn, J.T., and Street, R.A., "Charge Collection and Capacitance in Continuous film Flat Panel Detectors," SPIE Conference on Physics of Medical Imaging, SPIE vol. 3977, pp. 26-37, Feb. 2000.

Sze, S.M., "Basic CCD Structure," in Physics of Semiconductor Devices, 2nd ed., New York: John Wiley & Sons, 1981, pp. 412-416.

Fossum, E. R., "CMOS Image Sensors: Electronic Camera-On-A-Chip," IEEE Transactions on Electron Devices, vol. 44, No. 10, pp. 1689-1698, Oct. 1997.

Karim, K. S., Nathan, A., and Rowlands, J. A., "Alternate Pixel Architectures for Large Area Medical Imaging," SPIE Conference on Physics of Medical Imaging, SPIE vol. 4320, pp. 35-46, Feb. 2001.

Sequin, H. Carlo and Tompsett, F. Michael, "Charge Transfer Devices", Academic Press, Inc., Bell Telephone Laboratories, Inc., pp. 19-23, 1975.

Written Opinion of the International Searching Authority corresponding to International Application No. PCT/US2005/022471, ISA/US, dated Apr. 17, 2008, 3 pages.

International Preliminary Report on Patentability corresponding to International Application No. PCT/US2005/022471, International Bureau of WIPO, dated Feb. 24, 2009, 5 pages.

Communication Pursuant to Article 94(3) EPC corresponding to European Patent Application No. 05 676 471.5-2203, European Patent Office, Nov. 26, 2009, 7 pgs.

* cited by examiner

INTEGRATED MIS PHOTOSENSITIVE DEVICE USING CONTINUOUS FILMS

RELATED APPLICATIONS

This is continuation-in-part of U.S. patent application Ser. No. 10/882,603, filed Jul. 1, 2004, and entitled "Integrated MIS Photosensitive Device Using Continuous Films".

BACKGROUND OF THE INVENTION

1. Field of the Invention

The present invention relates to image sensors, and in particular, to image sensors with pixel circuits implemented with metal-insulator-semiconductor (MIS) photodiodes.

2. Description of the Related Art

Image sensors, such as those used for large area X-ray imaging, often use pixel circuits in which a mesa-isolated MIS photodiode is used as the photosensitive device. (A mesa-isolated device is formed by etching away a portion of the active materials, leaving a "mesa" of active materials.) Another common photosensitive device is a mesa-isolated p-i-n photodiode. Yet another conventional photosensitive device is a p-i-n photodiode comprised substantially of continuous films. However, such conventional photosensitive devices have disadvantages. Both the mesa-isolated MIS and p-i-n photodiodes typically generate poor image signals. The p-i-n photodiode comprised substantially of continuous films exhibits significant crosstalk among adjacent pixels.

Referring to FIG. 1, a conventional embodiment 10a of a pixel circuit implemented with a mesa-isolated MIS photodiode and a thin-film transistor (TFT) is typically integrated as shown. Starting with a substrate 12, various layers of dielectric (insulator), semiconductor and conductive materials are formed (e.g., deposited). For example, on the top surface of the substrate 12, a patterned layer of conductive material (e.g., metal) forms the bottom electrode 20a of the MIS photodiode 14a and the gate terminal 32 of the TFT 16. Next is a patterned layer of dielectric material which forms the dielectric 26a of the MIS photodiode 14a and the gate dielectric 34 of the TFT 16. Next is a patterned layer of intrinsic amorphous silicon (i a-Si) material which forms one of the semiconductor layers 24a, the light absorbing layer, of the MIS photodiode 14a and the channel 36 of the TFT 16. Next is a patterned layer of n+ amorphous silicon which forms the remaining semiconductor layer, the ohmic contact 22a, and, effectively, the top electrode of the MIS photodiode 14a and ohmic contacts 38 for the drain and source terminals of the TFT 16. Next is another patterned conductive layer (e.g., metal) which forms the drain 42 and source 44 terminals of the TFT 16, the data line 46, and the bias line 30. Following all of this is a layer of passivation (dielectric) 50.

Referring to FIG. 2, another embodiment 10b of a conventional pixel circuit uses a mesa-isolated p-i-n photodiode 14b instead of a mesa-isolated MIS photodiode. In this embodiment 10b, the structure of the TFT 16 is substantially the same as the embodiment 10a of FIG. 1. In place of the MIS photodiode 14a, however, a p-i-n photodiode 14b is used. The patterned layer of conductive material (e.g., metal) forming the source terminal 44 of the TFT 16 also forms the bottom electrode 20b of the p-i-n photodiode 14b. Next is a patterned layer of n+ amorphous silicon 28b, followed by a patterned layer of intrinsic amorphous silicon 24b, the light absorbing layer, and then a patterned layer of p+ amorphous silicon 22b which together form the p-i-n structure of the photodiode 14b. Next is a patterned layer of optically transparent conductive material (e.g., indium tin oxide, or ITO) which forms the top electrode 18b. Next is a patterned layer of dielectric material which forms an interlayer dielectric 52, through which a via is formed to allow conductive material (e.g., metal) to be deposited to form the bias line 30 in contact with the top electrode 18b of the photodiode 14b. Lastly is a layer of passivation 50.

Referring to FIG. 3, an alternative embodiment 10c of a conventional pixel circuit using a p-i-n photodiode 14c is similar to the embodiment 10b of FIG. 2, except that a substantial portion of the photodiode 14c is formed by using continuous films, as opposed to being formed in a mesa-isolated structure. Accordingly, the fabrication and materials used for the various photodiode layers 24c, 22c and 18c are the same, but in a continuous film.

As noted above, a disadvantage common to mesa-isolated MIS and p-i-n photodiode sensors is low signal levels. With a mesa-isolated structure, such photosensitive elements have fill-factors less than unity (fill-factor is defined as the area of the photosensitive element divided by the overall pixel area). Hence, not all of the light impinging upon the pixel is absorbed by the photosensitive element. Accordingly, maximum possible signal strength cannot be achieved.

The mesa-isolated MIS photodiode structure of FIG. 1 has a further disadvantage. The same film that is used to form the channel 36 of the TFT 16 is also used to form the light absorbing layer 24a of the MIS photodiode 14a. Generally, TFT 16 performance is optimized when the channel 36 thickness is thin, while MIS photodiode 14a performance is optimized when the light absorbing layer 24a is thick. With a single film, the performance of one or both of the TFT 16 and MIS photodiode 14a may suffer as the chosen film thickness may not be optimum for one or both.

With respect to signal strength, the p-i-n photodiode 14c formed substantially of continuous films, as shown in the embodiment 10c of FIG. 3, has improved signal strength. With this photosensitive element having a near unity fill-factor, nearly maximum signal strength can be achieved. However, this structure can suffer from significant crosstalk between adjacent pixels. For example, the interface 54 between the interlayer dielectric 52 and the light absorption layer 24c can have a nonzero conductance. Accordingly, potential differences between the bottom electrodes 20c of adjacent pixels produce small currents between such pixels, i.e., crosstalk.

SUMMARY OF THE INVENTION

An integrated photosensitive device with a metal-insulator-semiconductor (MIS) photodiode constructed with one or more substantially continuous layers of semiconductor material and with a substantially continuous layer of dielectric material.

In accordance with one embodiment of the presently claimed invention, an integrated photosensitive device includes a substrate and an MIS photodiode at least a portion of which is disposed over the substrate. The MIS photodiode includes: first and second electrodes; one or more dielectrics at least a portion of at least one of which is disposed between the first and second electrodes, wherein at least one of the one or more dielectric portions comprises a respective substantially continuous layer of dielectric material; one or more semiconductors at least a portion of at least one of which is disposed between one of the one or more dielectrics and one of the first and second electrodes, wherein at least one of the one or more semiconductor portions comprises a respective substantially continuous layer of semiconductor material; and a third electrode a portion of which is disposed, at least in part, in a non-coplanar manner along a peripheral portion of one of the first and second electrodes.

In accordance with another embodiment of the presently claimed invention, an integrated photosensitive device includes a substrate and an MIS photodiode at least a portion of which is disposed over the substrate. The MIS photodiode includes: a plurality of conduction layers including at least first, second and third conduction layers comprising first, second and third films of conductive material, respectively; one or more insulation layers at least a portion of at least one of which is disposed between the first and second conduction layers, wherein at least one of the one or more insulation layer portions comprises a respective substantially continuous film of insulation material; and one or more semiconductor layers at least a portion of at least one of which is disposed between one of the one or more insulation layers and one of the first and second conduction layers, wherein at least one of the one or more semiconductor layer portions comprises a respective substantially continuous film of semiconductor material; wherein one of the first and second conduction layers includes a perimeter, and said third conduction layer is disposed, at least in part, in a non-coplanar manner along part of the perimeter.

In accordance with another embodiment of the presently claimed invention, an integrated photosensitive array includes a substrate and a plurality of MIS photodiodes at least a portion of which is disposed in an array over the substrate. Each one of the at least a portion of the plurality of MIS photodiodes includes: first and second electrodes; one or more dielectrics at least a portion of at least one of which is disposed between the first and second electrodes, wherein at least one of the one or more dielectric portions comprises a respective substantially continuous layer of dielectric material; one or more semiconductors at least a portion of at least one of which is disposed between one of the one or more dielectrics and one of the first and second electrodes, wherein at least one of the one or more semiconductor portions comprises a respective substantially continuous layer of semiconductor material; and a third electrode a portion of which is disposed, at least in part, in a non-coplanar manner along a peripheral portion of one of said first and second electrodes.

In accordance with another embodiment of the presently claimed invention, an integrated photosensitive device includes a substrate and an MIS photodiode at least a portion of which is disposed over the substrate. The MIS photodiode includes: first and second electrodes; one or more dielectrics at least a portion of at least one of which is disposed between the first and second electrodes, wherein at least one of the one or more dielectric portions comprises a respective substantially continuous layer of dielectric material; one or more semiconductors at least a portion of at least one of which is disposed between one of the one or more dielectrics and one of the first and second electrodes, wherein at least one of the one or more semiconductor portions comprises a respective substantially continuous layer of semiconductor material; and a third electrode substantially bordering one of the first and second electrodes with a portion of the third electrode disposed, at least in part, in a non-coplanar manner along a peripheral portion of one of the first and second electrodes.

In accordance with another embodiment of the presently claimed invention, an integrated photosensitive device includes a substrate and an MIS photodiode at least a portion of which is disposed over the substrate. The MIS photodiode includes: first and second electrodes; one or more dielectrics at least a portion of at least one of which is disposed between the first and second electrodes; one or more semiconductors at least a portion of at least one of which is disposed between one of the one or more dielectrics and one of the first and second electrodes; and a third electrode a portion of which is disposed, at least in part, in a non-coplanar manner along a peripheral portion of one of the first and second electrodes.

In accordance with another embodiment of the presently claimed invention, an integrated photosensitive device includes a substrate and an MIS photodiode at least a portion of which is disposed over said substrate. The MIS photodiode includes: a plurality of conduction layers including at least first, second and third conduction layers comprising first, second and third films of conductive material, respectively; one or more insulation layers at least a portion of at least one of which is disposed between the first and second conduction layers; and one or more semiconductor layers at least a portion of at least one of which is disposed between one of the one or more insulation layers and one of the first and second conduction layers. One of the first and second conduction layers includes a perimeter, and the third conduction layer is disposed, at least in part, in a non-coplanar manner along part of the perimeter.

In accordance with another embodiment of the presently claimed invention, an integrated photosensitive device includes a substrate and a plurality of MIS photodiodes at least a portion of which is disposed in an array over the substrate. Each one of the at least a portion of the plurality of MIS photodiodes includes: first and second electrodes; one or more dielectrics at least a portion of at least one of which is disposed between the first and second electrodes; one or more semiconductors at least a portion of at least one of which is disposed between one of the one or more dielectrics and one of the first and second electrodes; and a third electrode a portion of which is disposed, at least in part, in a non-coplanar manner along a peripheral portion of one of the first and second electrodes.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Figure 4:
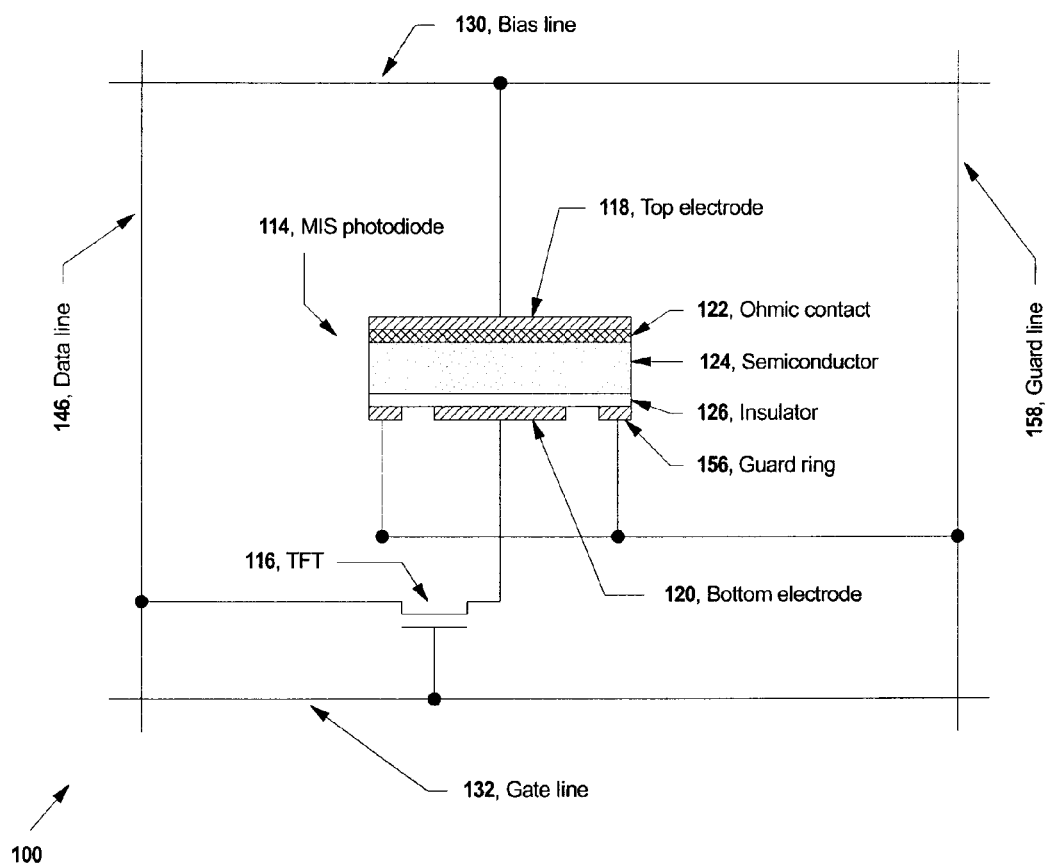
FIG. 4 is a schematic diagram of a pixel circuit in accordance with one embodiment of the presently claimed invention.

Referring to FIG. 4, a pixel circuit 100 in accordance with one embodiment of the presently claimed invention includes the MIS photodiode 114 and a TFT 116 connected to a bias line 130, gate line 132 and data line 146, all in accordance with well known pixel circuit techniques. The MIS photodiode 114 includes an optically transparent top electrode 118 and a bottom electrode 120, between which are the semiconductor layers 122, 124 and insulator 126 in a vertical relationship as shown. Additionally, however, the bottom electrode 120 is bordered by a guard ring 156 connected to a guard line 158 through which a voltage is applied to inhibit crosstalk between adjacent pixels (discussed in more detail below).

Figure 5:
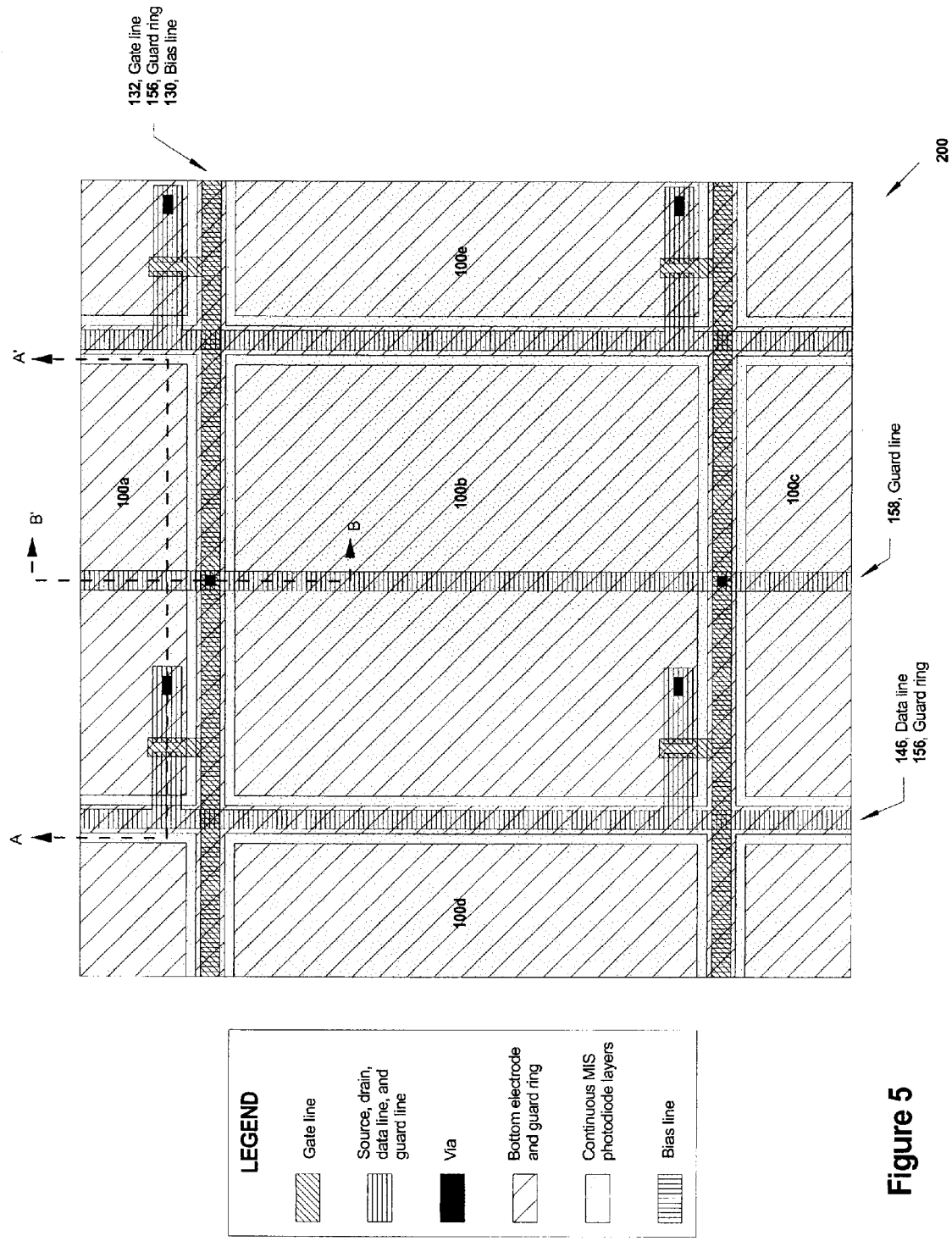
FIG. 5 is a plan view of a portion of an integrated circuit containing pixel circuits corresponding to the schematic of FIG. 4.

Referring to FIG. 5, a plan view of a portion 200 of an integrated circuit containing pixel circuits implemented according to the pixel circuit 100 of FIG. 4 illustrates a pixel circuit 100b with adjacent pixel circuits 100a, 100c, 100d, 100e above, below, to the left and to the right, respectively.

Figure 1:
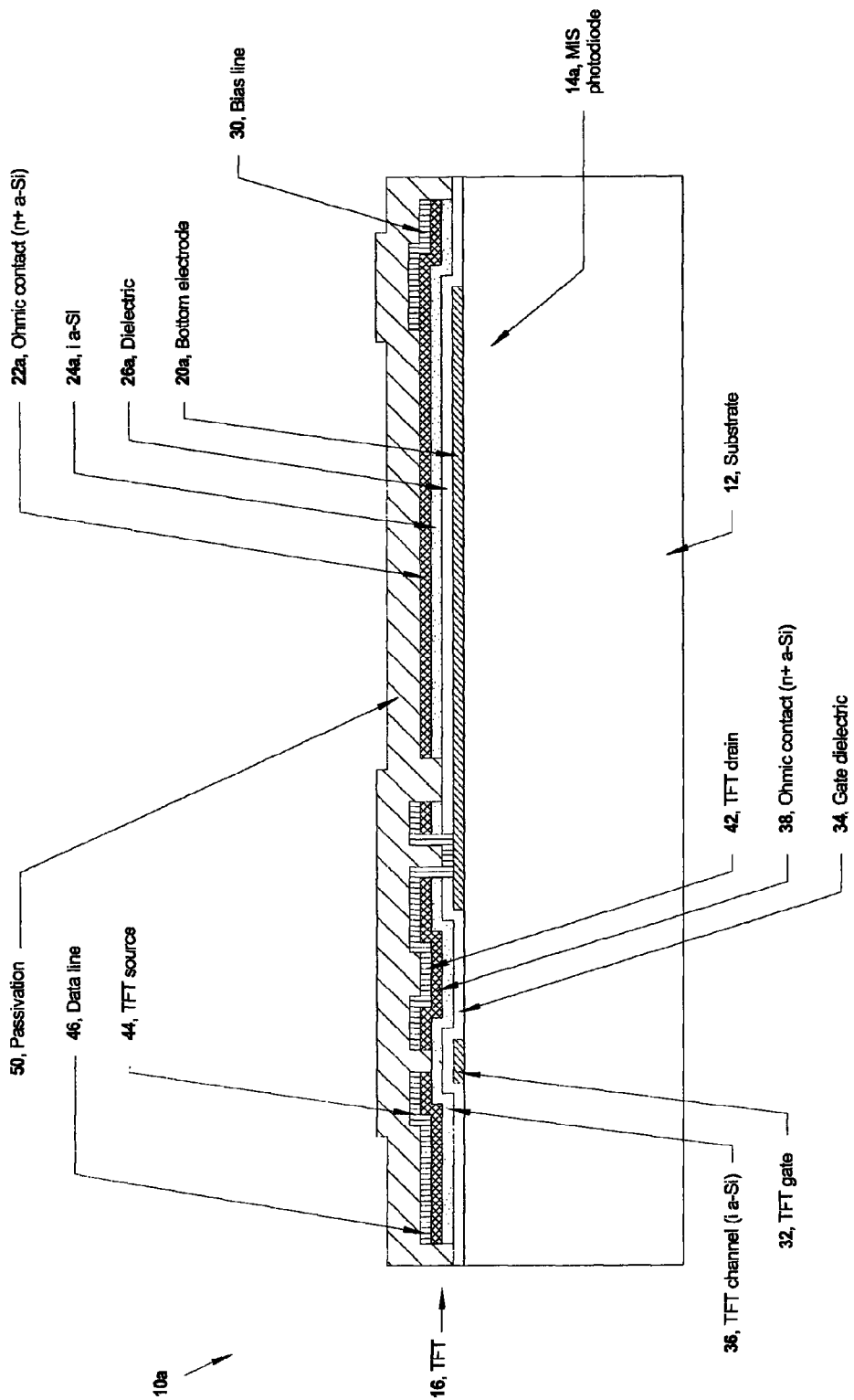
FIG. 1 is a cross section view of a conventional pixel circuit using a MIS photodiode.
Figure 2:
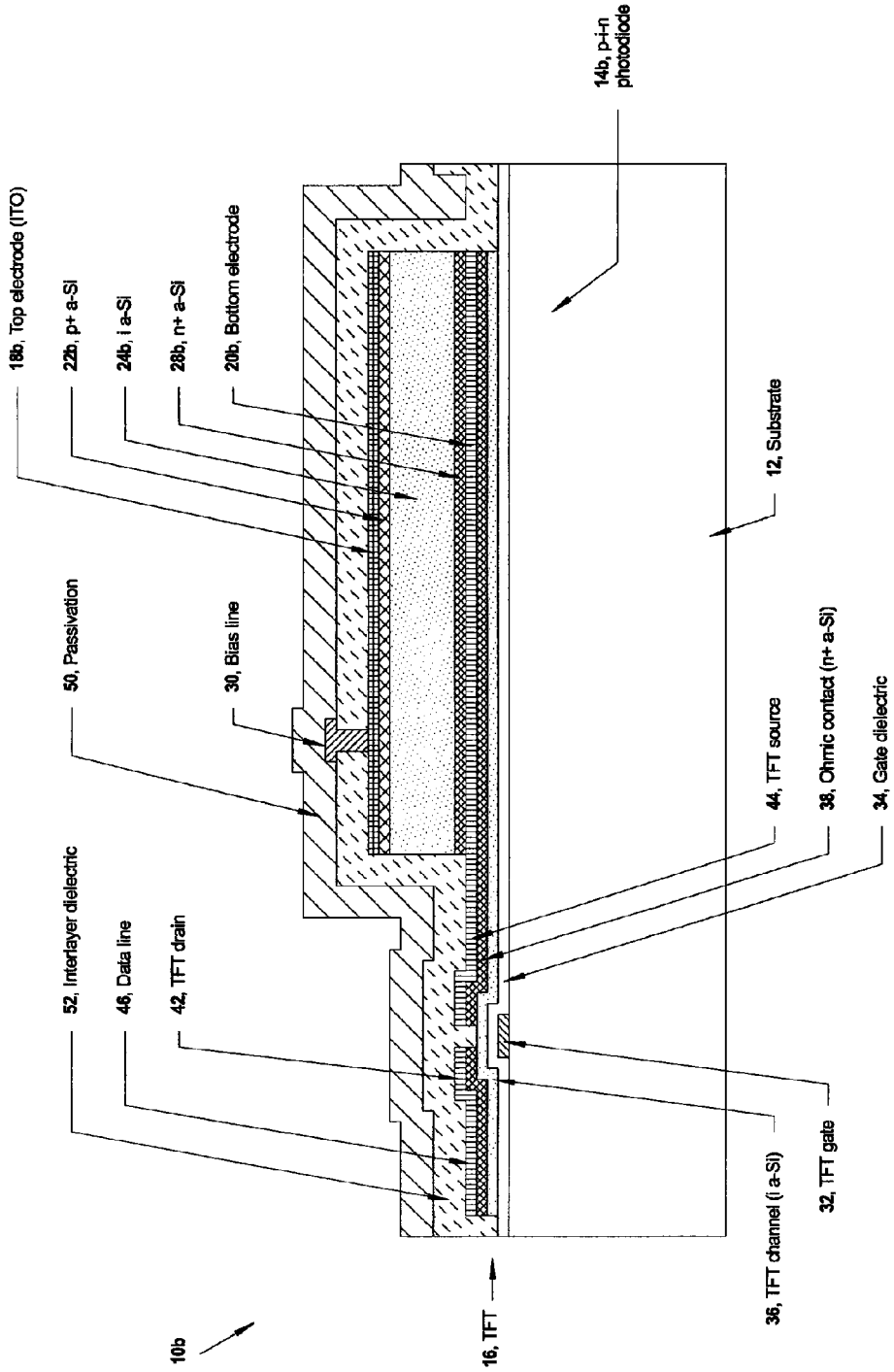
FIG. 2 is a cross section view of a conventional pixel circuit using a p-i-n photodiode.
Figure 3:
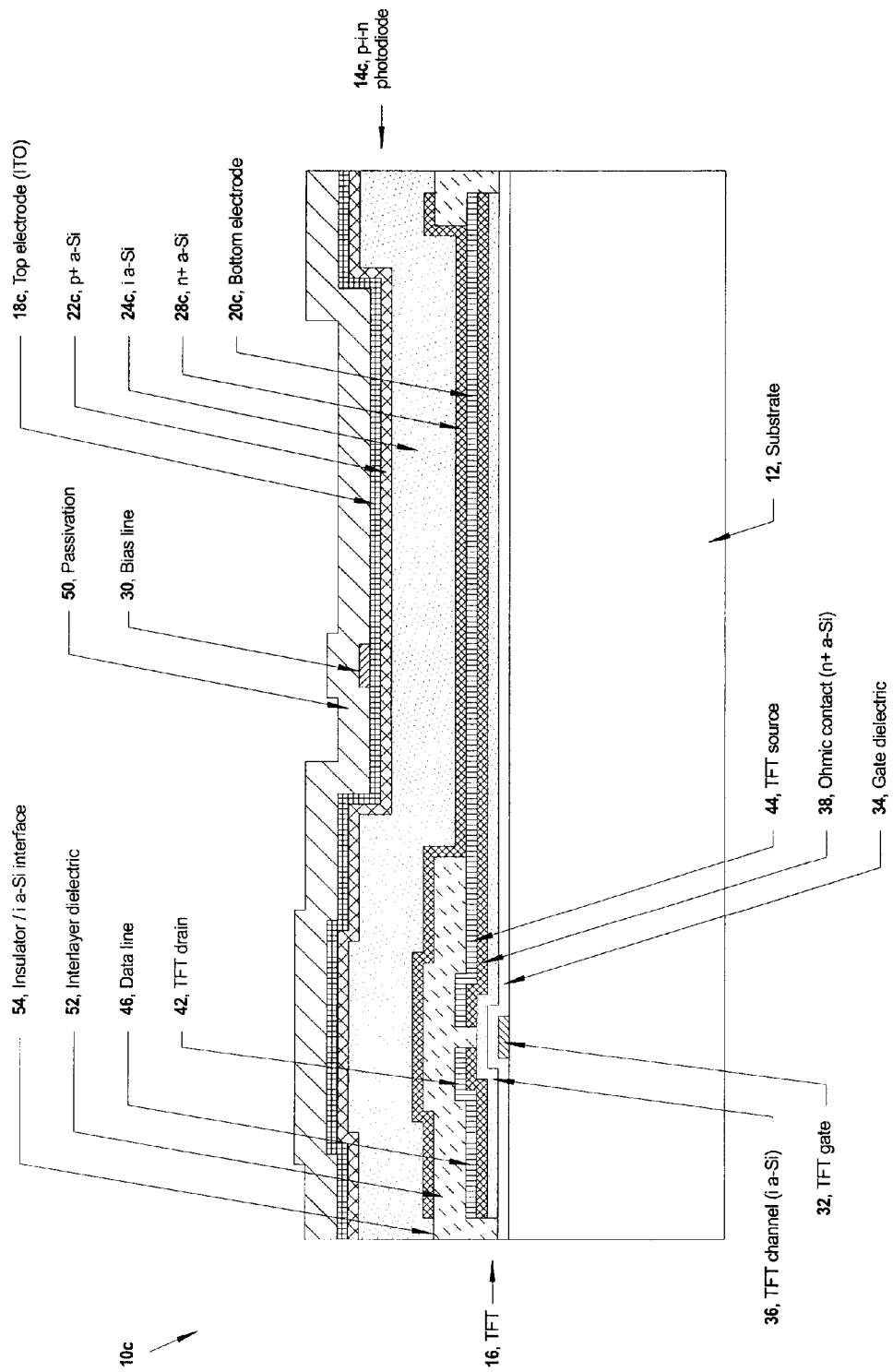
FIG. 3 is a cross section view of another conventional pixel circuit using a p-i-n photodiode.
Figure 6:
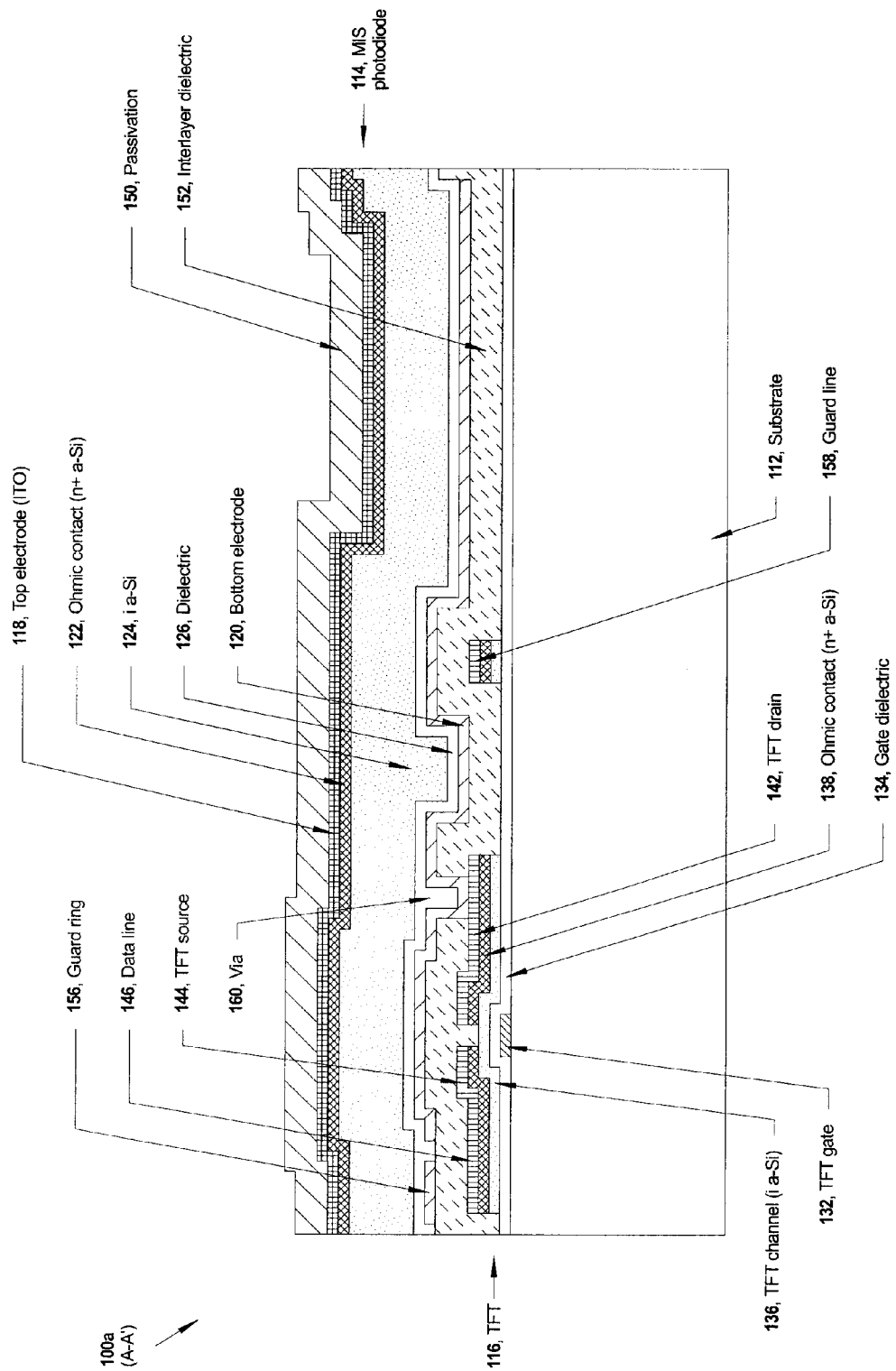
FIG. 6 is a cross section view along line A-A' of FIG. 5.

Referring to FIG. 6, a cross section view along line A-A' of FIG. 5 illustrates the structure of the TFT 116 and MIS photodiode 114. The structure of the TFT 116 is substantially the same as that for the conventional pixel circuits 10a, 10b, 10c of FIGS. 1, 2 and 3. Immediately above the substrate 112 (the primary role of which is that of a base, support or foundation for the remaining layers of materials), the guard line 158 is created from the patterned amorphous silicon 136, 138 and conductive 142 layers which are also used to form portions of the TFT 116. Above the guard line 158 and TFT 116 is an interlayer dielectric material 152 through which a via 160 is formed to allow contact between the bottom electrode 120 of the MIS photodiode 114 and the drain terminal 142 of the TFT 116. The layer of material used to form the bottom electrode 120 is patterned so as to also form the guard ring 156. Next is a layer of dielectric 126, followed by a layer 124 of intrinsic amorphous silicon, the light absorbing layer. Next is a layer 122 of n+ amorphous silicon to form the ohmic contact to the optically transparent conductive layer 118 above. The conductive layer 118 forms the top electrode of the MIS photodiode 114. Lastly is a layer 150 of passivation.

Figure 7:
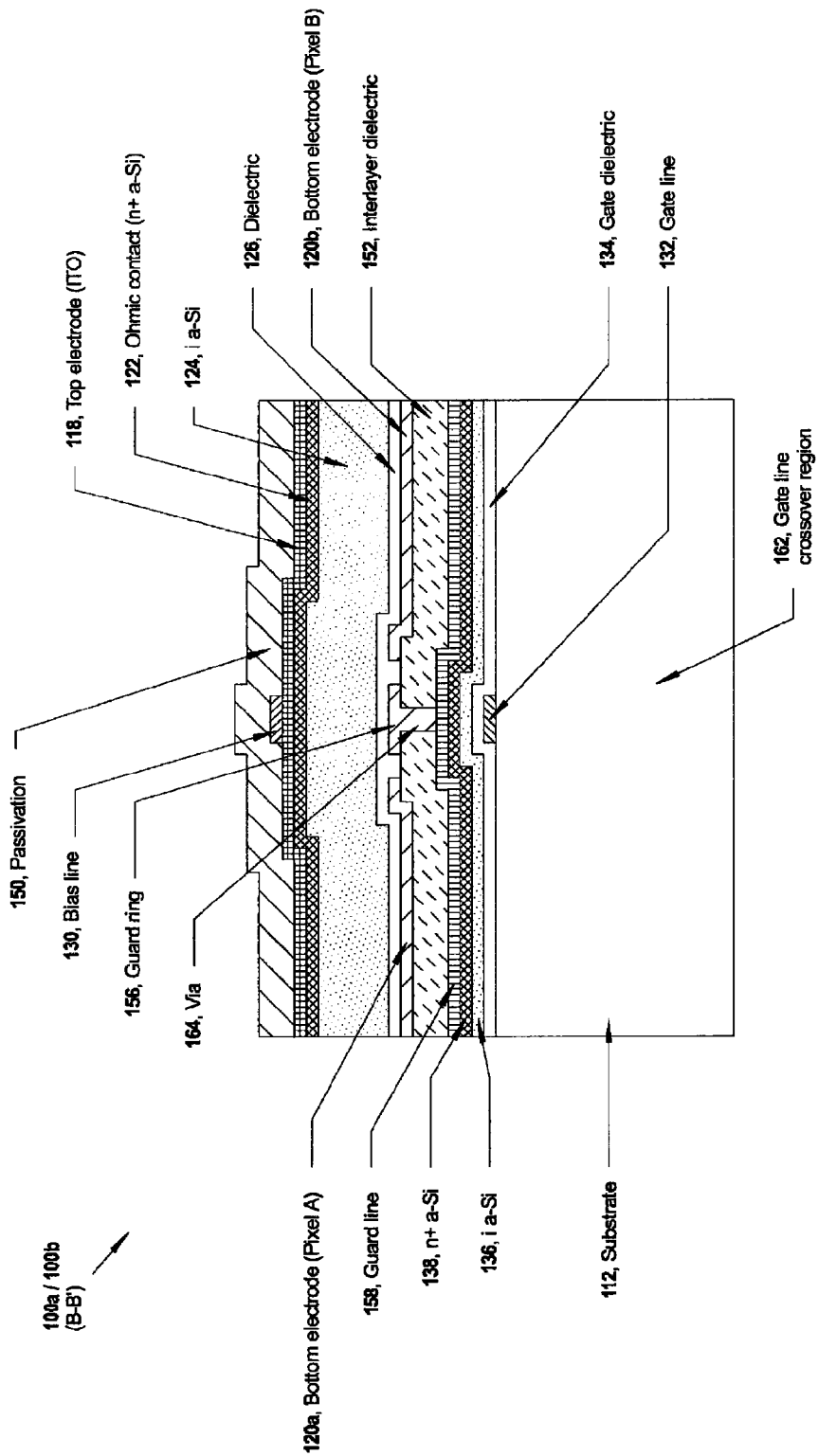
FIG. 7 is a cross section view along line B-B' of FIG. 5.

Referring to FIG. 7, a cross section view along line B-B' of FIG. 5 illustrates the structure of the gate line crossover region 162 between adjacent pixels 100a, 100b. Through this region 162 passes the bias line 130, gate line 132, guard ring 156, and guard line 158. The guard ring 156 is patterned from the same layer of material used to form the bottom electrodes 120a, 120b of the adjacent pixel circuits 100a, 100b. The guard ring 156 makes contact to the guard line 158 through a via 164 formed in the interlayer dielectric 152.

Based upon the foregoing, it can be seen that the pixel circuit 100 of FIG. 4, when implemented as shown in FIGS. 5, 6 and 7, uses a MIS photodiode 114 formed substantially of continuous films. In particular, the insulator 126, semiconductors 122 and 124, and electrode 118 portions of the photodiode structure are continuous. The metal portion of the structure is patterned such that each pixel includes a bottom electrode 120 bordered, e.g., surrounded, by a guard ring 156 which serves to diminish crosstalk between adjacent pixels.

Figure 8:
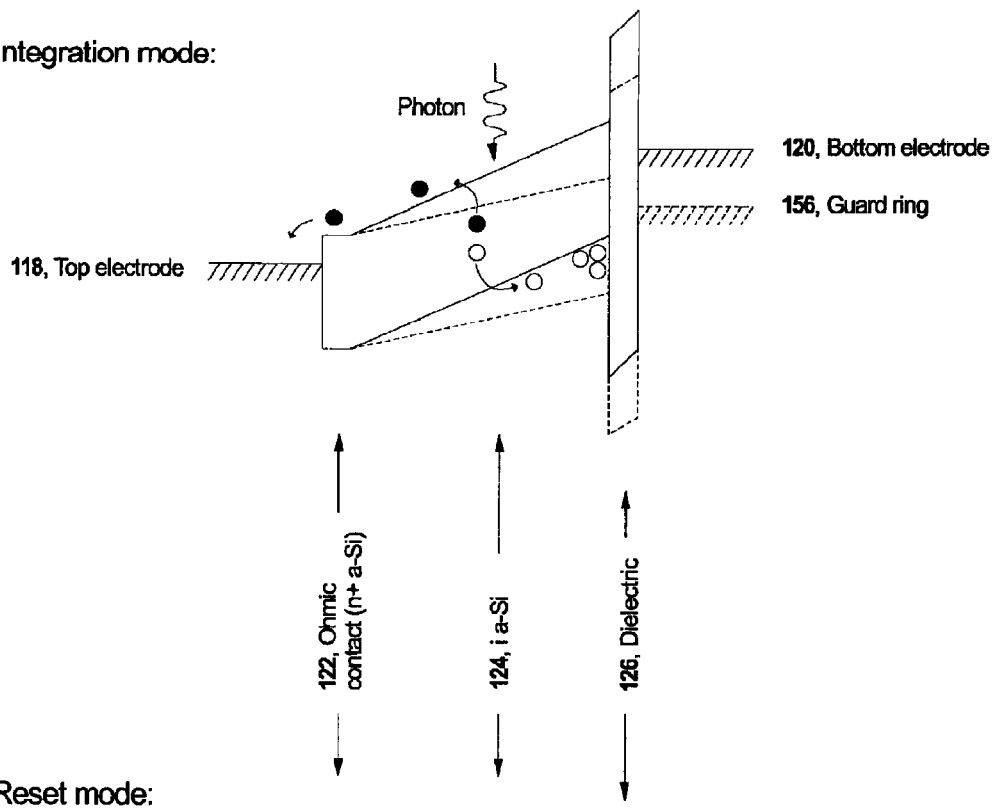
FIG. 8 is a diagram depicting the energy bands associated with the integration and reset operations performed by the pixel circuit of FIG. 4.
Figure 8:
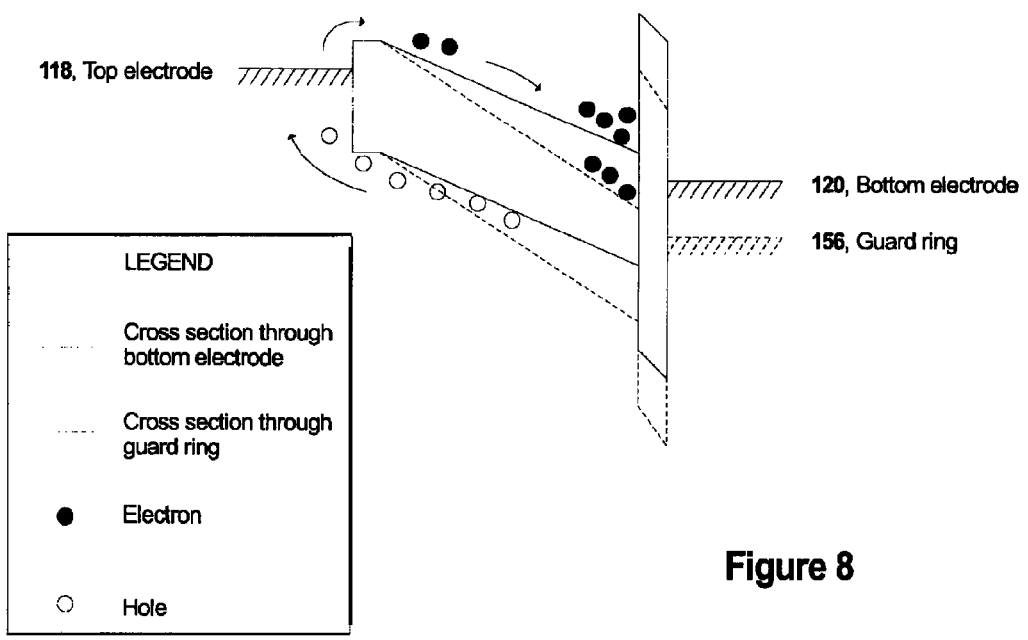

Referring to FIG. 8, a pixel circuit in accordance with the presently claimed invention operates (at least in part) as follows. In the integration mode of operation, the top electrode 118 has a potential which is positive compared to the potential of the bottom electrode 120. When light impinges upon the intrinsic layer 124, the light is absorbed and electron-hole pairs are generated. By reason of the electric field between the electrodes 118 and 120, the generated electrons are then introduced to the top electrode 118, and the holes move within the intrinsic layer 124 to reach an interface of the insulating, or dielectric, layer 126. However, the holes cannot move into the insulating layer 126 and therefore remain within the intrinsic layer 124. The hole charge which accumulates at the semiconductor/insulator interface as a result of the absorption of the incident light constitutes the signal of the pixel circuit.

During the reset mode of operation, the top electrode 118 has a potential which is negative compared to the potential of the bottom electrode 120. Electrons are injected by the electrode 118 into the ohmic contact semiconductor layer 122 and subsequently into the intrinsic semiconductor layer 124. The injected electrons travel to the interface between the semiconductor layer 124 and the dielectric layer 126 and recombine with the holes at that interface. The holes remaining in the intrinsic layer 124 are introduced to the top electrode 118.

The guard ring 156 has a potential which is positive compared to the bottom electrode 120. This produces a potential barrier to the hole signal charges which accumulate above the bottom electrode 120 during the integration mode of operation. This potential barrier inhibits, if not prevents, crosstalk between adjacent pixels.

Figure 9:
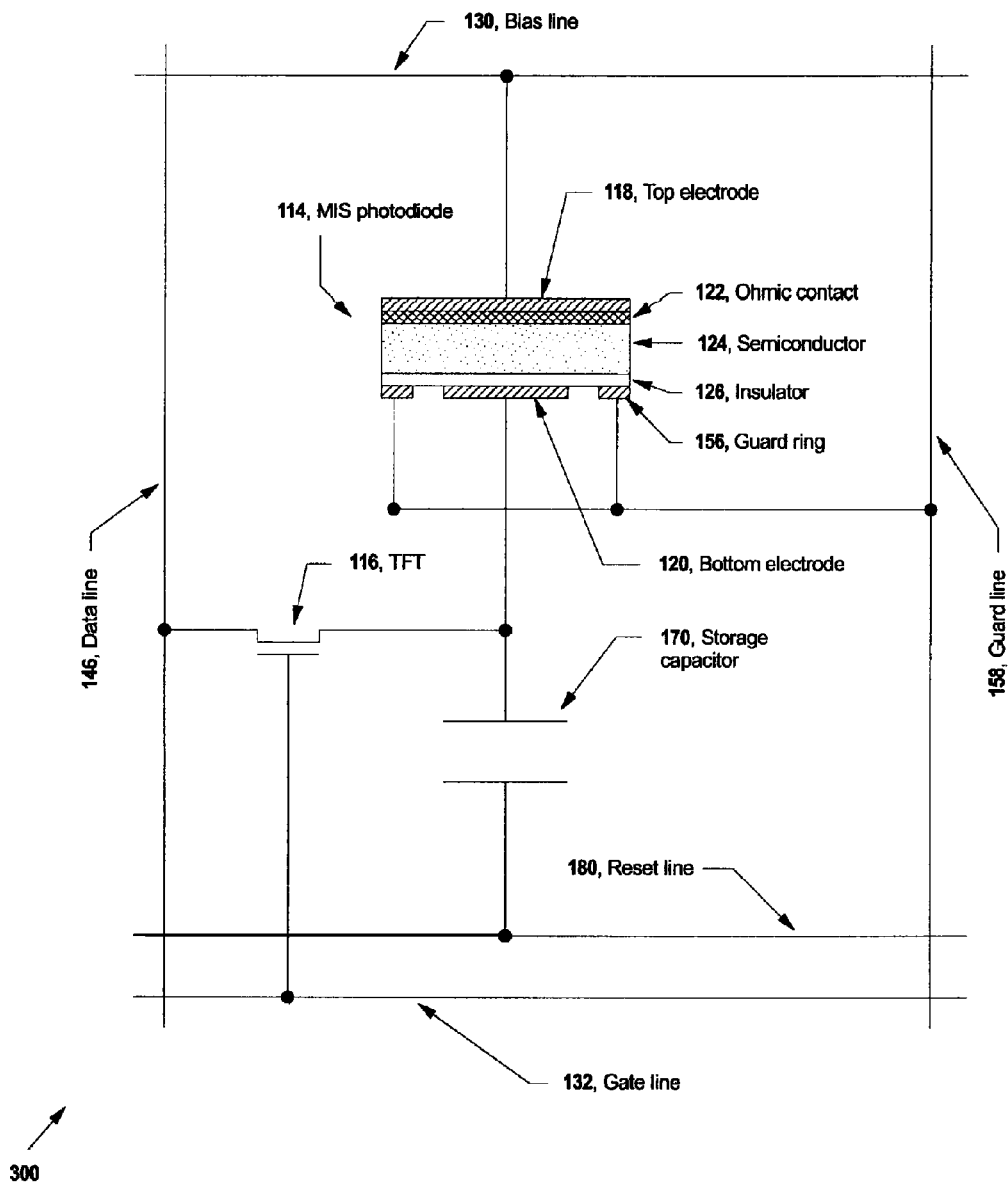
FIG. 9 is a schematic diagram of a pixel circuit in accordance with another embodiment of the presently claimed invention.

Referring to FIG. 9, a pixel circuit 300 in accordance with another embodiment of the presently claimed invention includes the MIS photodiode 114 and TFT 116 connected to the bias line 130, gate line 132, data line 146 and guard line 158, just as in the embodiment of FIG. 4, but also includes a storage capacitor 170 and a reset line 180. These additional elements provide for increased signal handling capacity and an additional reset mechanism. Regarding the former, while the thick semiconductor layer 124 used in the MIS photodiode 114 yields maximum light absorption, it can also result in low capacitance for the photodiode, and therefore limited charge handling capacity. This is solved by the introduction of the storage capacitor 170 which is designed to have high capacitance, and therefore large charge handling capacity. Regarding the latter, in the embodiment of FIG. 4, the imager is reset by pulsing the bias line 130 to a negative voltage relative to the voltage of the bottom electrode 120 (which is nominally at the voltage of the data line 146). In this alternative embodiment 300, the MIS photodiode 114 can now be reset by pulsing the reset line 180 to a sufficiently positive voltage relative to the bias line 130.

Figure 10:
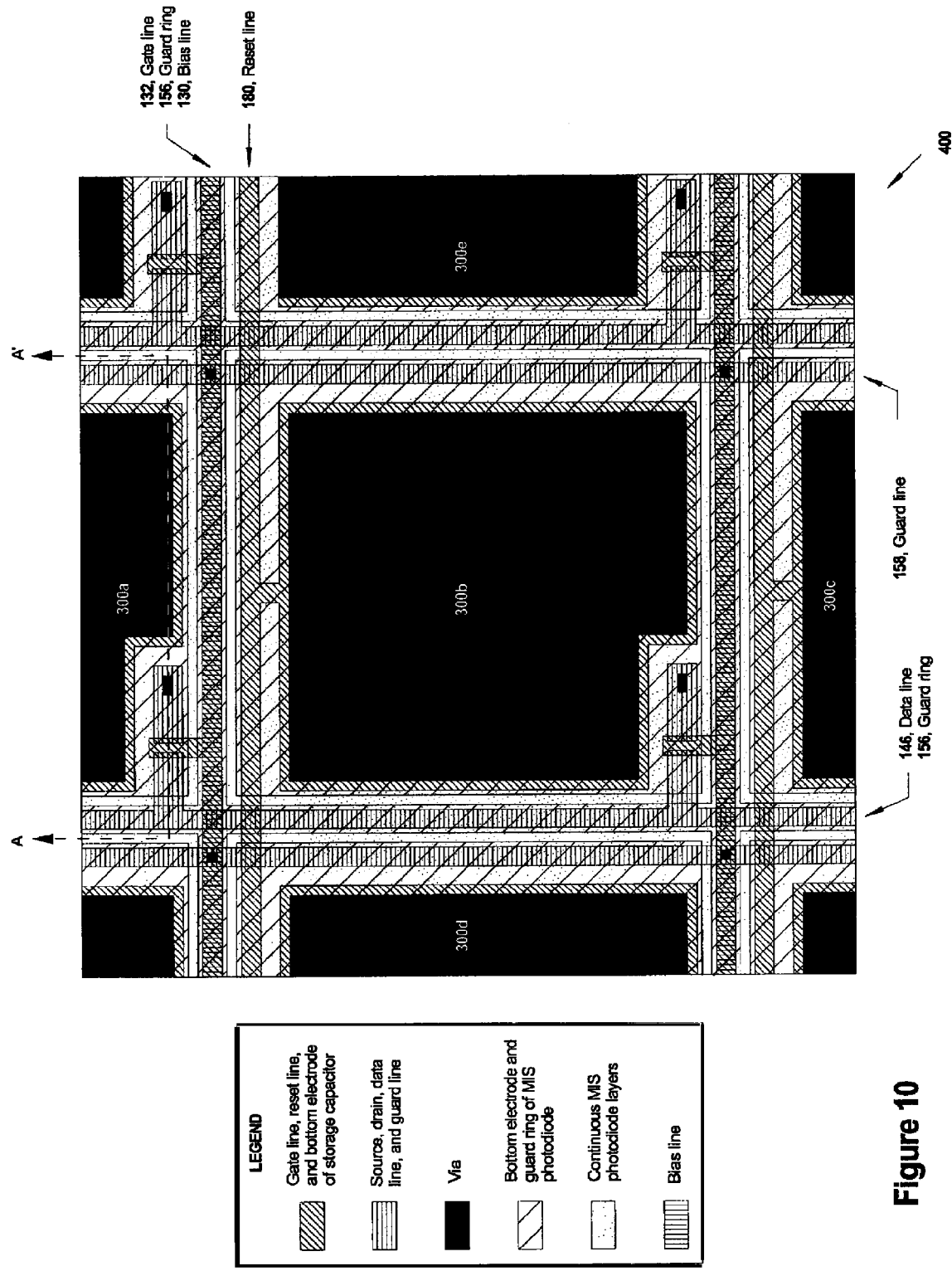
FIG. 10 is a plan view of a portion of an integrated circuit containing pixel circuits corresponding to the schematic of FIG. 9.

Referring to FIG. 10, a plan view of a portion 400 of an integrated circuit containing pixel circuits implemented according to the pixel circuit 300 of FIG. 9 illustrates a pixel circuit 300b with adjacent pixel circuits 300a, 300c, 300d, 300e above, below, to the left and to the right, respectively.

Figure 11:
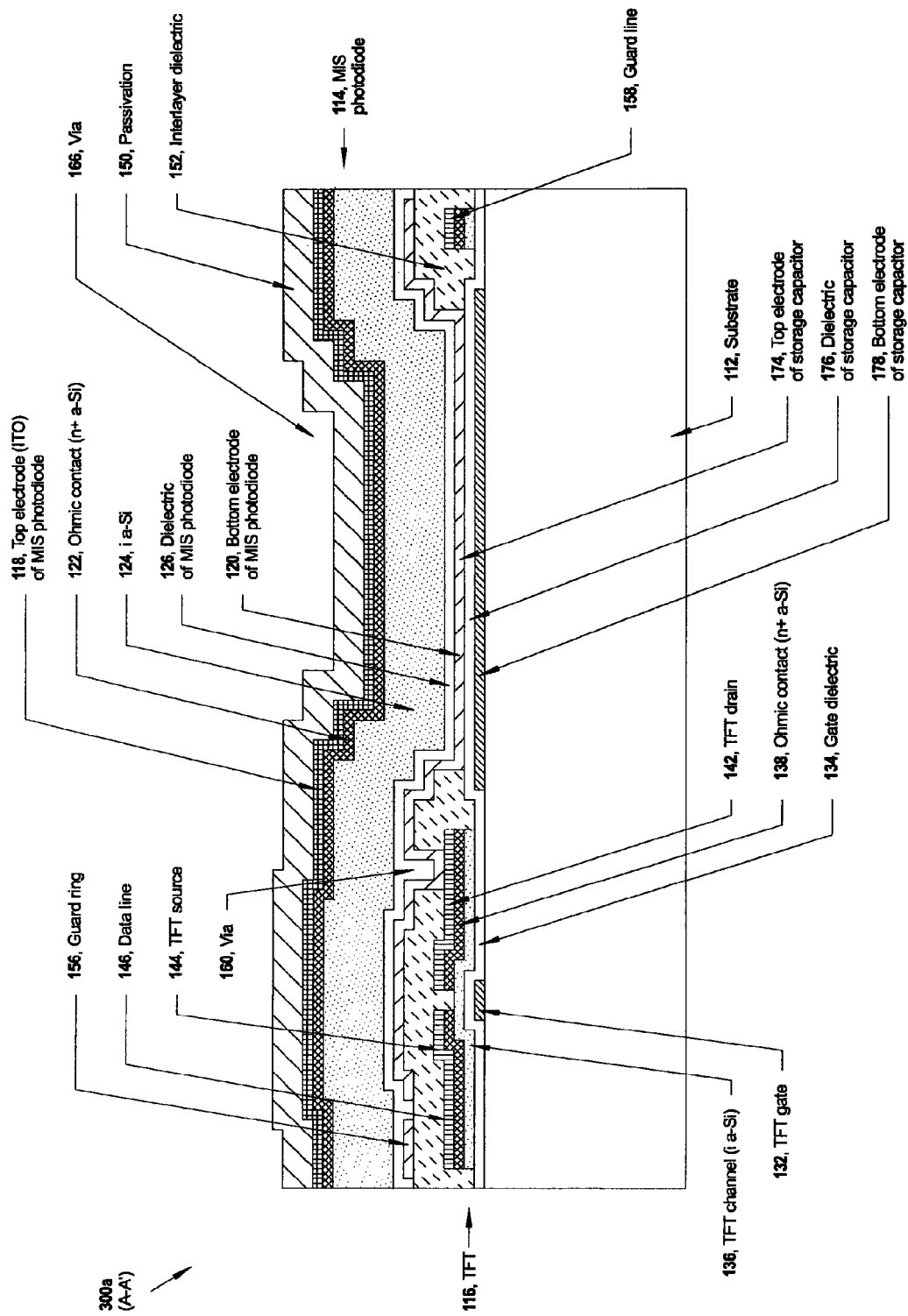
FIG. 11 is a cross section view along line A-A' of FIG. 10.

Referring to FIG. 11, a cross section view along line A-A' of FIG. 10 illustrates the structure of the TFT 116 and MIS photodiode 114. The structure of the TFT 116 is substantially the same as that for the conventional pixel circuits 10a, 10b, 10c of FIGS. 1, 2 and 3. Immediately above the substrate 112, the bottom electrode 178 of the storage capacitor 170 is formed from the patterned layer of conductive material also used to form the gate terminal 132 of the TFT 116. Next is the dielectric 176 of the storage capacitor 170 which also serves as the gate dielectric 134 of the TFT 116. The guard line 158 is created from the patterned amorphous silicon 136, 138 and conductive 142 layers which are also used to form various other portions of the TFT 116. Above the guard line 158 and TFT 116 is an interlayer dielectric material 152 through which vias 160 and 166 are formed. The via 160 allows contact between the bottom electrode 120 of the MIS photodiode 114 and the drain terminal 142 of the TFT 116. The via 166 allows contact of the bottom electrode 120 of the MIS photodiode 114 with the dielectric 176 of the storage capacitor 170, thereby forming the top electrode 174 of the storage capacitor 170. The layer of material used to form the bottom electrode 120 of the MIS photodiode 114 is patterned to also form the guard ring 156. Above the patterned material layer forming the bottom electrode 120 and the guard ring 156 of the MIS photodiode 114 is a layer of dielectric 126, followed by a layer 124 of intrinsic amorphous silicon, the light absorbing layer. Next is a layer 122 of n+ amorphous silicon to form the ohmic contact to the optically transparent conductive layer 118 above. The conductive layer 118 forms the top electrode of the MIS photodiode 114. Lastly is a layer 150 of passivation.

Figure 12:
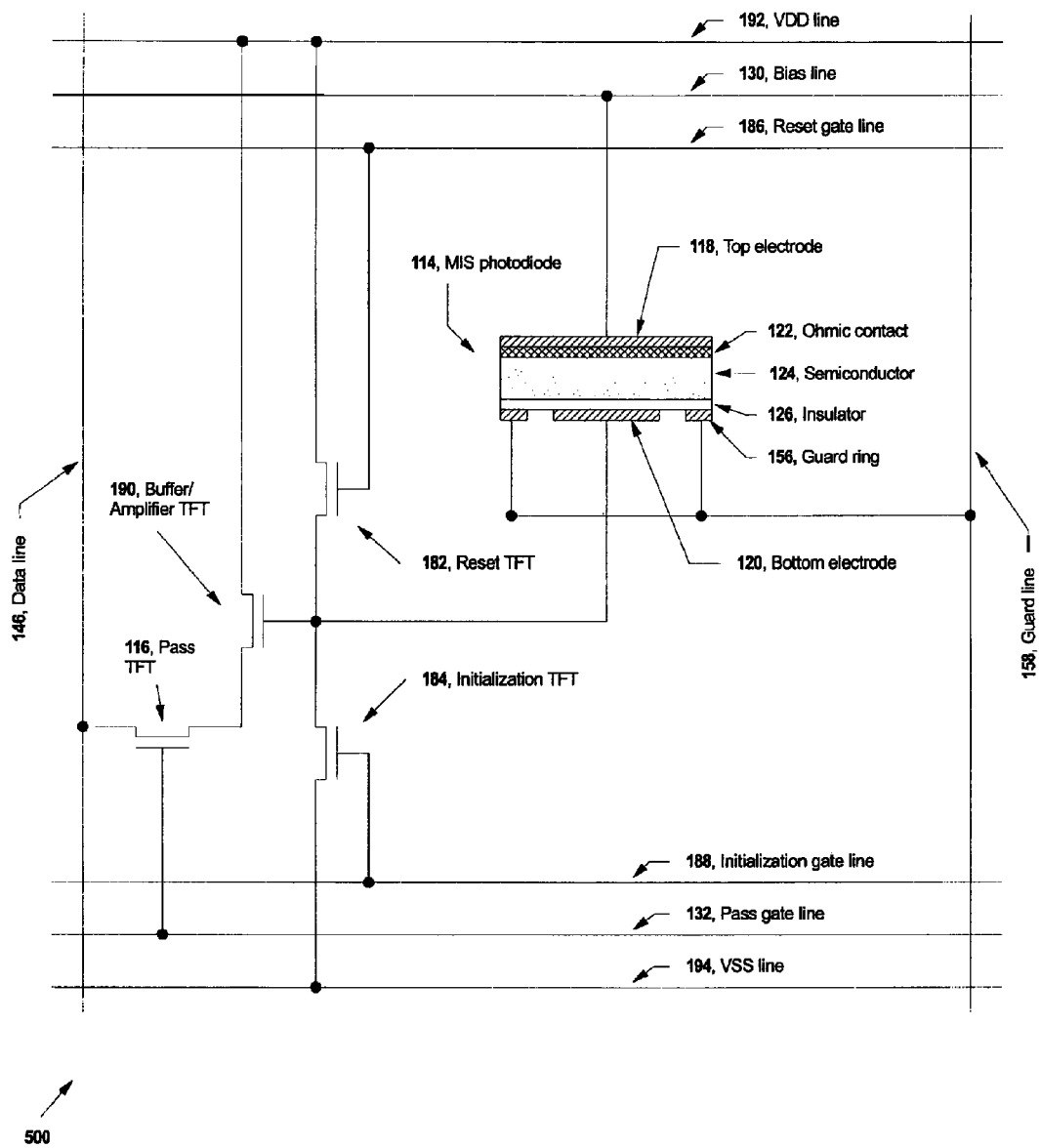
FIG. 12 is a schematic diagram of a pixel circuit in accordance with yet another embodiment of the presently claimed invention.

Referring to FIG. 12, a pixel circuit 500 in accordance with another embodiment of the presently claimed invention includes the MIS photodiode 114 and the pass TFT 116 connected to the bias line 130, pass gate line 132, data line 146 and guard line 158, just as in FIG. 4, but also includes a buffer/amplifier TFT 190, a reset TFT 182, an initialization TFT 184, a reset gate line 186, an initialization gate line 188, a VDD line 192, and a VSS line 194. The buffer/amplifier TFT 190 may operate in either a voltage or a current output mode, depending on how the data line 146 is terminated. The reset TFT 182 clears the MIS photodiode 114 of all signal charge after integration mode, and the initialization TFT 184 sets the potential of the bottom electrode 120 of the MIS photodiode 114 prior to the integration mode. The pixel circuit 500 is an example of a class of pixel circuits known as "active" pixel circuits, which are defined as pixel circuits that contain amplifiers.

Figure 13:
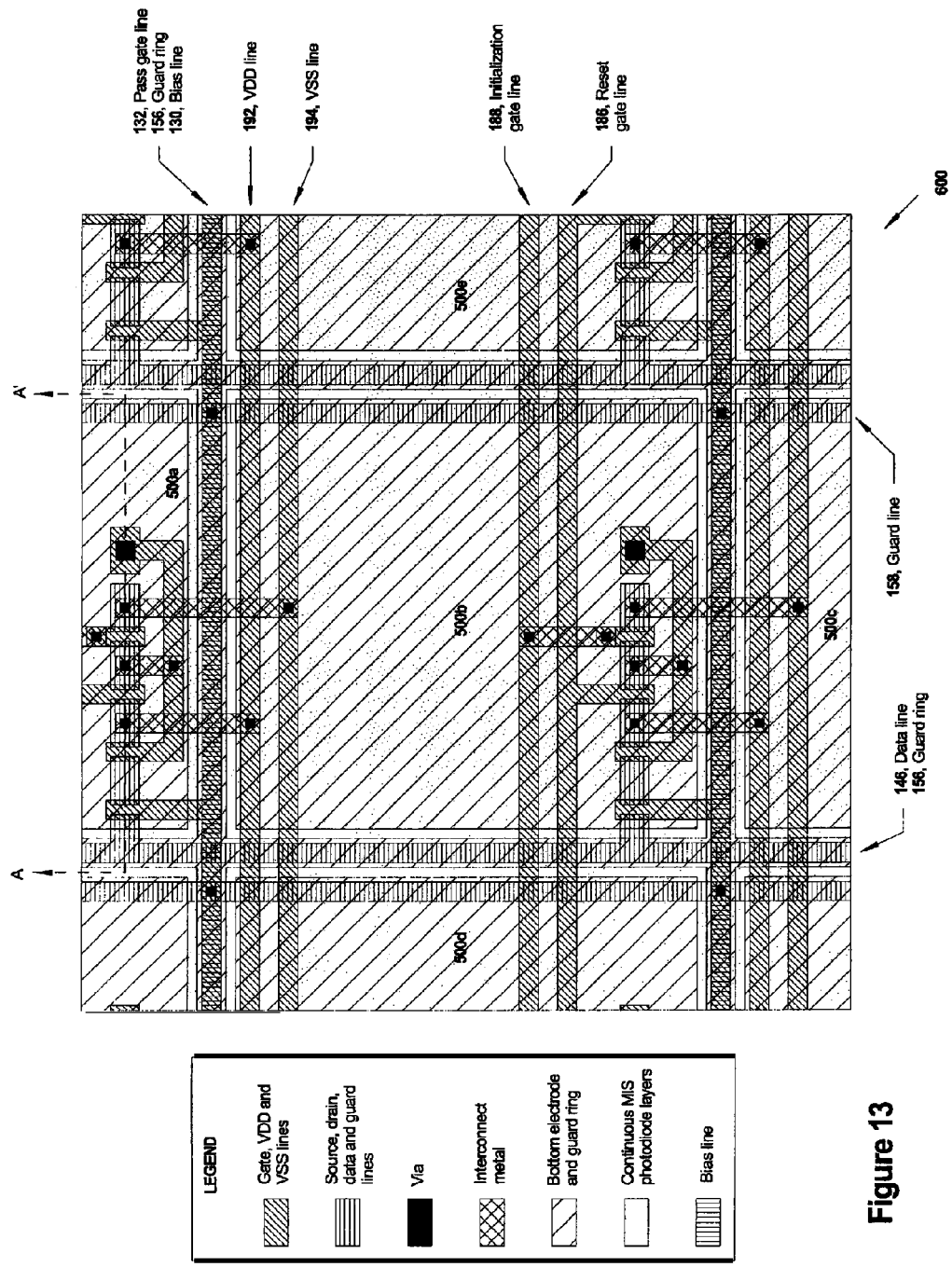
FIG. 13 is a plan view of a portion of an integrated circuit containing pixel circuits corresponding to the schematic of FIG. 12.

Referring to FIG. 13, a plan view of a portion 600 of an integrated circuit containing pixel circuits implemented according to the pixel circuit 500 of FIG. 12 illustrates a pixel circuit 500b with adjacent pixel circuits 500a, 500c, 500d, 500e above, below, to the left and to the right, respectively.

Figure 14:
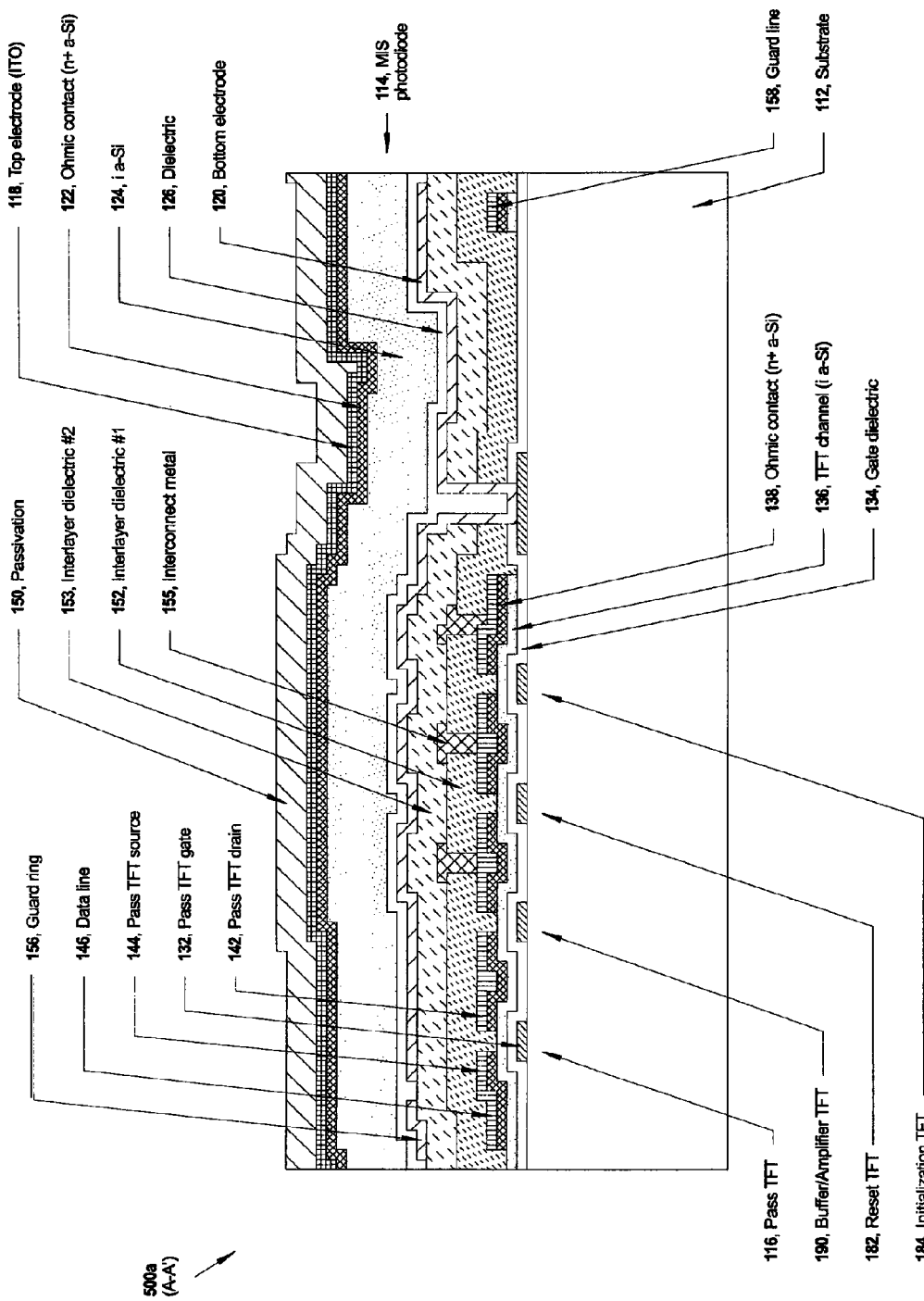
FIG. 14 is a cross section view along line A-A' of FIG. 13.

Referring to FIG. 14, a cross section view along line A-A' of FIG. 13 illustrates the structure of the MIS photodiode 114, the pass TFT 116, the buffer/amplifier TFT 190, the reset TFT 182, and the initialization TFT 184. The structure of all TFTs is substantially the same as that for the TFT in the conventional pixel circuits 10a, 10b, and 10c of FIGS. 1, 2, and 3. Immediately above the substrate 112, the guard line 158 is created from the patterned amorphous silicon 136, 138 and conductive 142 layers which are also used to form portions of the TFTs. Above the guard line 158 and TFTs is a first interlayer dielectric material 152 through which via holes are formed to allow a patterned layer of metal to interconnect the circuit elements. Above the interconnect metal is a second interlayer dielectric material 153. A via hole through both interlayer dielectric films 152 and 153 allows the bottom electrode 120 of the MIS photodiode 114 to make contact to a metal pad which in turn connects (not shown) to the gate of the buffer/amplifier TFT 190. The layer of material used to form the bottom electrode 120 of the MIS photodiode 114 is patterned to also form the guard ring 156. Above the patterned material layer forming the bottom electrode 120 and the guard ring 156 of the MIS photodiode 114 is a layer of dielectric 126, followed by a layer 124 of intrinsic amorphous silicon, the light absorbing layer. Next is a layer 122 of n+ amorphous silicon to form the ohmic contact to the optically transparent conductive layer 118 above. The conductive layer 118 forms the top electrode of the MIS photodiode 114. Lastly is a layer 150 of passivation.

Based upon the foregoing, it should be understood that a MIS photodiode 114 in accordance with the presently claimed invention advantageously has a higher pixel fill-factor than both mesa-isolated MIS and p-i-n photodiodes, thereby producing greater signal levels. A MIS photodiode 114 provides further improvement over the mesa-isolated MIS photodiode structure by allowing the light absorbing semiconductor layer 124 to be optimized for maximum light absorption, and thereby maximum signal generation, without regard to the impact of such film thickness optimization on TFT performance.

Further still, the use of guard rings which border, e.g., substantially surround, the bottom electrode advantageously reduce, if not eliminate, the crosstalk between adjacent pixels which is common in photodiode structures comprised substantially of continuous films.

Moreover, a MIS photodiode structure in accordance with the presently claimed invention using continuous films can potentially reduce manufacturing costs as compared to mesa-isolated and continuous film types of p-i-n photodiode structures. Without a requirement for p-type amorphous silicon material, a MIS photodiode structure in accordance with the presently claimed invention can be produced using the same manufacturing facilities that are used to produce standard TFT backplanes for liquid crystal displays (LCDs). Such manufacturing facilities benefit from high volume, and should, therefore, yield products at lower costs.

In another embodiment of the presently claimed invention which will prove advantageous under suitable conditions, the bias lines 130 are eliminated (see FIGS. 4-5, 7, 9-10 and 12-13). If the active area of the imager is sufficiently small, and if the sheet resistance of the continuous top electrode 118 can be made sufficiently low, then it will not be necessary to have bias lines 130 which address every pixel in the image sensor array. Rather, a global bias connection can be made to the top electrode 118 at the periphery of the array. Since the bias lines 130 are the only structures which obscure light that impinges on the MIS photodiodes 114, the elimination of the bias lines 130 should result in pixels with near unity fill-factor. Elimination of the bias lines 130 should also lead to higher yield in the manufacturing process.

In another embodiment of the presently claimed invention which will prove advantageous under suitable conditions, the optically transparent conductive material (e.g., ITO) generally used to form the top electrode 118 is eliminated (see FIGS. 6-7, 11 and 14). If the active area of the imager is sufficiently small, and if the sheet resistance of the n+ amorphous silicon semiconductor layer 122 is sufficiently low, then the n+ amorphous silicon semiconductor layer 122 may also serve as the top electrode 118. Elimination of the optically transparent conductive material should lead to higher yield in the manufacturing process.

In another embodiment of the presently claimed invention which will prove advantageous under suitable conditions, the guard lines 158 are eliminated (see FIGS. 4-7, 9-11 and 12-14). If the active area of the imager is sufficiently small, and if the sheet resistance of the guard ring lattice structure 156 can be made sufficiently low, then it will not be necessary to have guard lines 158 which address every pixel in the image sensor array. Rather, a global connection can be made to the guard ring lattice structure 156 at the periphery of the array. Elimination of the guard lines 158 should lead to higher yield in the manufacturing process.

In another embodiment of the presently claimed invention which may prove advantageous, additional dielectric layers are incorporated between the dielectric layer 126 and the semiconductor layer 124 (see FIGS. 4, 6-7, 9, 11-12 and 14). The dielectric material between the bottom electrodes 120 and the continuous semiconductor layer 124 must serve several purposes. This dielectric material must have sufficient thickness and structural integrity to not breakdown under the electric fields established between the bottom electrodes 120 and the continuous top electrode 118. This dielectric material must be sufficiently free of internal stresses so as to not warp the underlying substrate 12. This dielectric material must also form an interface with the continuous semiconductor layer 124 which minimizes electron and hole trap states (trap states lead to image lag problems; i.e., ghost images). It may be that no one continuous dielectric layer 126 can adequately satisfy all these requirements.

In another embodiment of the presently claimed invention which may prove advantageous, the guard ring 156 is formed from one or more layers of conductive material different from that used to form the bottom electrode 120 of the MIS photodiode 114 (See FIGS. 5-7, 10-11 and 13-14). This may be done, for example, to create a guard ring structure 156 which yields reduced parasitic capacitance of the data line 146 which is located underneath a portion of the guard ring 156. It is desirable to minimize the parasitic capacitance of the data line 146 as such capacitance can yield noise in the imaging process (particularly for the pixel circuits of FIGS. 4 and 9). A guard ring structure 156 which yields reduced data line 146 parasitic capacitance may be created subsequent to the formation of the bottom electrode 120, for example, by the deposition of additional dielectric material followed by the deposition of additional conductive material and then patterning these two layers to yield a guard ring 156 which is located vertically above the bottom electrode 120. The additional separation of the guard ring 156 from the data line 146 yields reduced parasitic capacitance of the data line 146.

Figure 15:
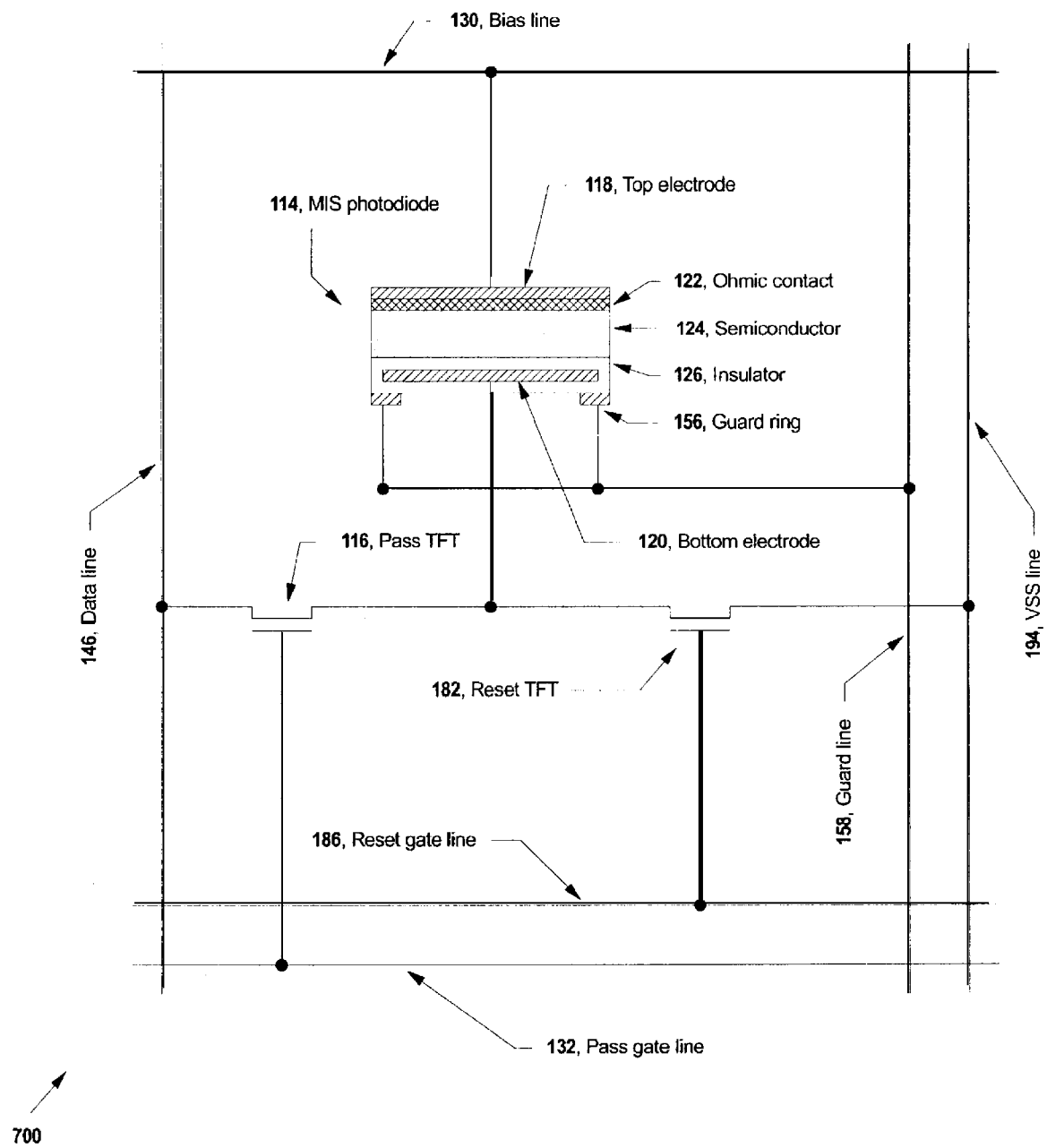
FIG. 15 is a schematic diagram of a pixel circuit in accordance with still another embodiment of the presently claimed invention.

Referring to FIG. 15, a pixel circuit 700 in accordance with another embodiment of the presently claimed invention includes the MIS photodiode 114 and the pass TFT 116 connected to the bias line 130, pass gate line 132, data line 146 and guard line 158, just as in FIG. 4. However, in this embodiment, the guard ring 156 and bottom electrode 120 are patterned separately from different layers of conductive material, as discussed above, with the guard ring 156 disposed below the bottom electrode 120 such that a portion of the guard ring 156 is overlapped by a portion of the bottom electrode 120. With this arrangement, the potential well for signal charge in the semiconductor region 124 above the bottom electrode 120 is maximized in spatial extent and is sharply defined. This arrangement also minimizes the possibility of the formation of an undesirable potential barrier between the portion of the semiconductor region 124 above the center of the guard ring 156 and the portion of the semiconductor region 124 above the edge of the bottom electrode 120. This, in turn, assures maximum signal collection and a near unity fill-factor.

Hence, from the foregoing discussion it can be seen that, as alternative embodiments, at least portions of the guard ring 156 can be disposed between the top 118 and bottom 120 electrodes, or below the bottom electrode 120. At least portions of the guard ring 156 can be disposed proximately above or below the bottom electrode 120 such that respective portions of the guard ring 156 and bottom electrode 120 mutually overlap. In other words, a common characteristic of these two alternatives is the mutually non-coplanar disposition, at least in part, of mutually proximate portions of the guard ring 156 and bottom electrode 120 (e.g., respective peripheral portions). Such a disposition can be achieved by forming the guard ring 156 and bottom electrode 120 in different device layers, as discussed above, and ensuring that the appropriate portions lie in different planes, or if formed in the same layer, then by simply ensuring that the appropriate portions lie in different planes.

Figure 16:
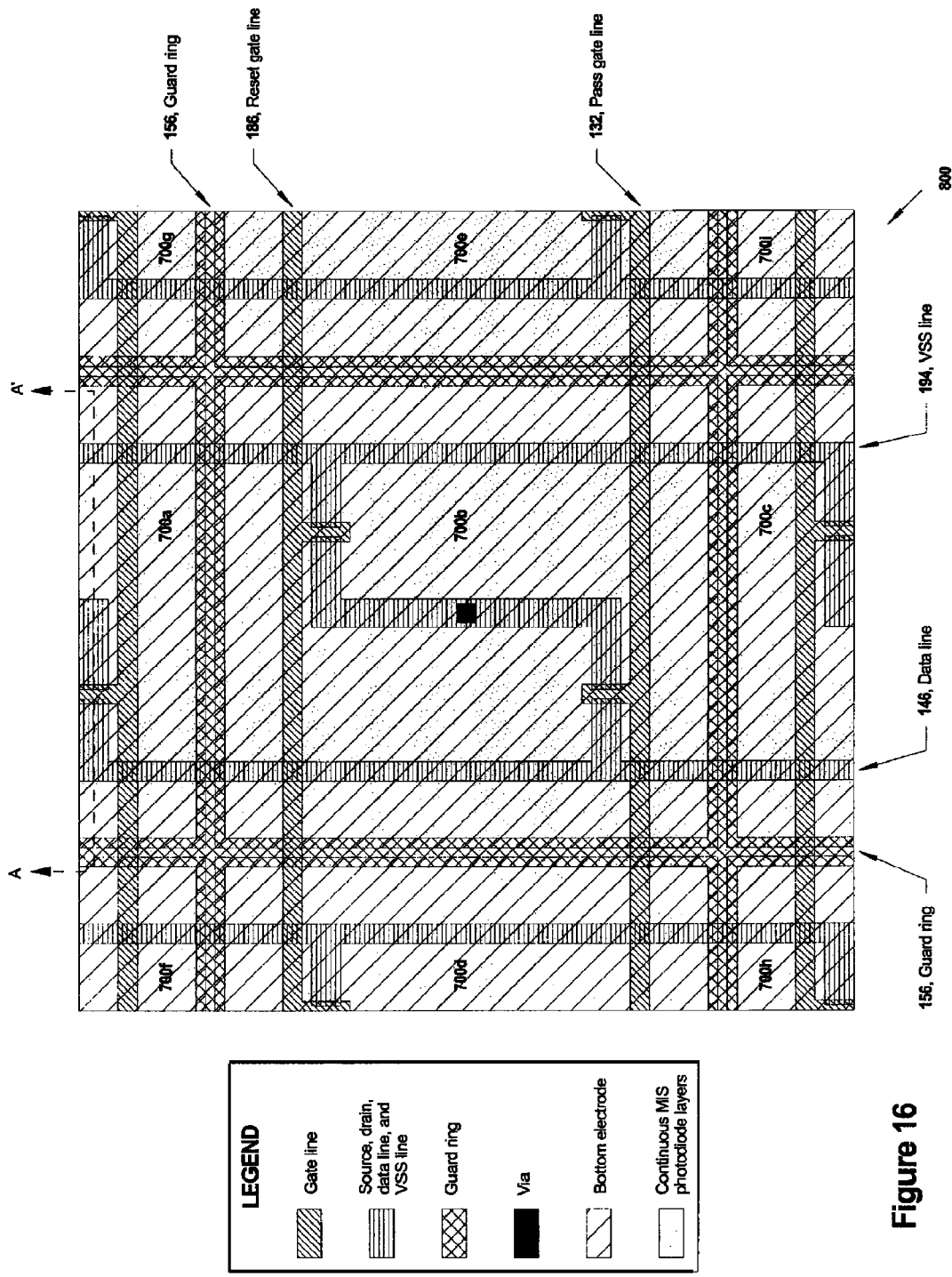
FIG. 16 is a plan view of a portion of an integrated circuit containing pixel circuits corresponding to the schematic of FIG. 15.
Figure 17:
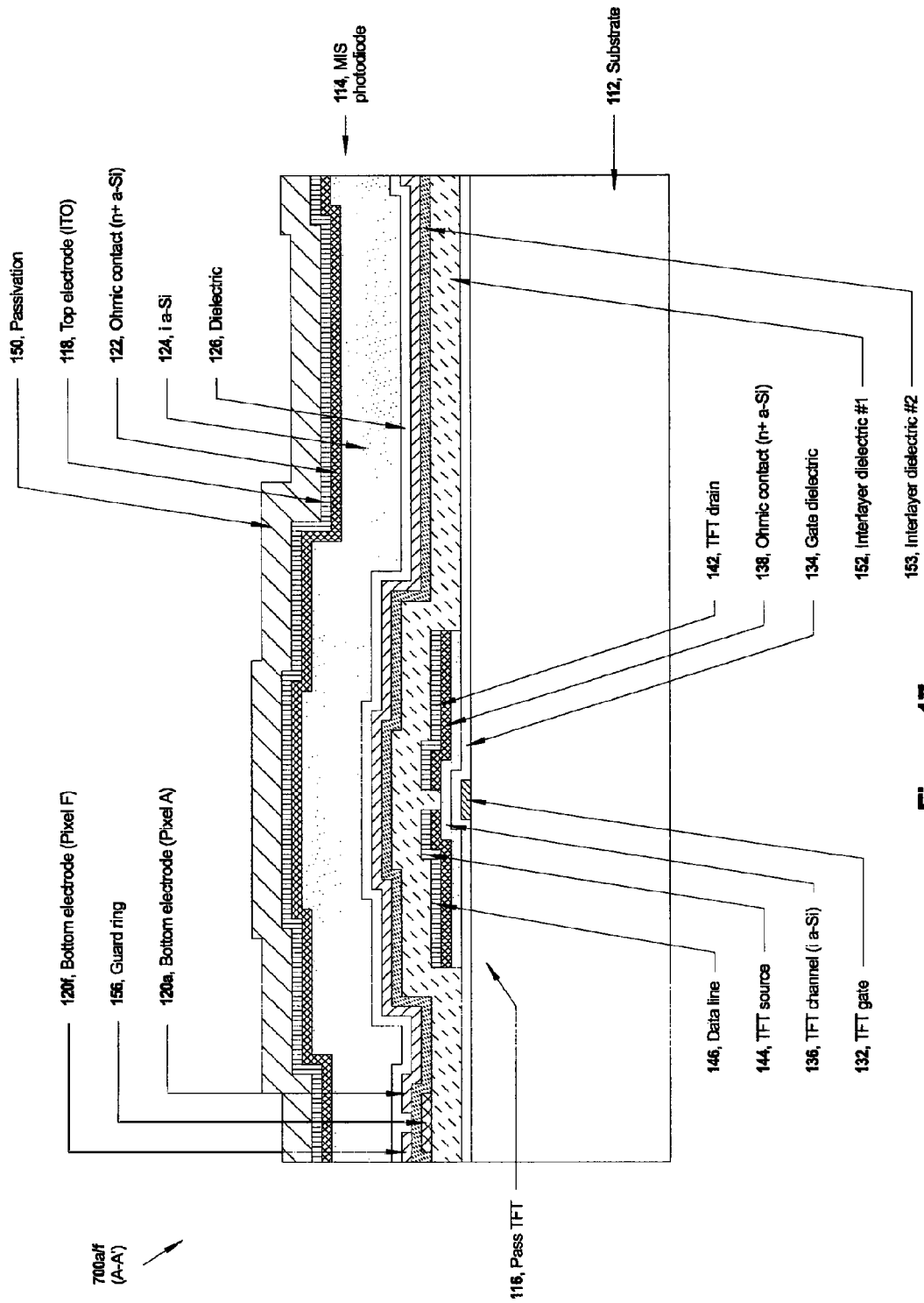
FIG. 17 is a cross section view along line A-A' of FIG. 16.

Referring to FIGS. 16 and 17, a plan view of a portion 800 of an integrated circuit containing pixel circuits implemented according to the pixel circuit 700 of FIG. 15 illustrates a pixel circuit 700b with surrounding pixel circuits 700a, 700c, 700d, 700e, 700f, 700g, 700h, 700i, and the cross section view along line A-A' illustrates the structure of the MIS photodiode 114 and pass TFT 116. The various structural features remain substantially similar to those discussed above for FIGS. 12-14, with the exception that the guard ring 156 and top electrode 118 are not connected to bus lines that run through each pixel. Instead, the guard ring 156 and top electrode 118 are connected globally to the guard line 158 and bias line 130, respectively, via metal lines at or near the periphery (not shown) of the pixel array. This simplifies the overall layout design and should allow for a higher manufacturing yield.

In another embodiment of the presently claimed invention, a p+ amorphous silicon layer is used as the doped amorphous silicon layer 122 which is in contact with the top electrode 118 of the MIS photodiode 114 (See FIGS. 4, 6-9, 11-12 and 14). In this case, all bias polarities would be the opposite of those in the description above, and the signal carriers would be electrons.

In further embodiments of the presently claimed invention, alternative materials can be used for any portion of the device structure. For example, organic electronic materials which have conducting, semiconducting, and insulating properties could replace the inorganic electronic materials with corresponding properties in the description above. For an embodiment employing organic electronic materials, the relative positions of the various material layers and the polarities of the signal carrier and operating voltages may change. Such changes may be necessary since organic TFTs typically have the gate electrode located vertically above the source and drain electrodes rather than beneath, and organic semiconducting materials are typically p-type rather than n-type. Nevertheless, the basic configuration of an MIS photodiode using continuous films and employing a guard ring, with remaining pixel circuitry underneath, may potentially be implemented using organic electronic materials.

In view of the Figures and the foregoing discussion, the fact that several of the features and characteristics of the present invention need not necessarily be absolute or complete should be immediately appreciated and readily understood by one of ordinary skill in the art. For example, various layers of material, such as the dielectric material 126, have been described as continuous. Clearly, such continuity need only be substantial, i.e., not necessarily absolute or complete but merely sufficient for the purposes of achieving the relevant objective or enabling the associated functionality, which is to be continuous virtually throughout the photodiode structure. (For example, it is well known that no process, including those used for semiconductor fabrication, is perfect, and that sometimes design considerations may require an insignificant void in what is an otherwise continuous structure.) Similarly, the proximity of the guard ring 156 with respect to its bordering of the bottom electrode 120 also need only be substantial, i.e., not necessarily absolute or complete but merely sufficient for the purposes of achieving the relevant objective or enabling the associated functionality, which is to maintain the desired electric field conducive to minimizing crosstalk between adjacent pixels.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including an integrated photosensitive device, comprising:
   a substrate; and
   a metal-insulator-semiconductor (MIS) photodiode at least a portion of which is disposed over said substrate and comprising
      first and second electrodes,
      one or more dielectrics at least a portion of at least one of which is disposed between said first and second electrodes, wherein at least one of said one or more dielectric portions comprises a respective at least substantially continuous layer of dielectric material,
      one or more semiconductors at least a portion of at least one of which is disposed between one of said one or more dielectrics and one of said first and second electrodes and is in planar contact with said one of said first and second electrodes, wherein at least one of said one or more semiconductor portions comprises a respective at least substantially continuous layer of semiconductor material, and said one of said first and second electrodes comprises a continuous electrode, and
      a third electrode a portion of which is disposed, at least in part, in a non-coplanar manner along a peripheral portion of another of said first and second electrodes, wherein said third electrode is electrically insulated from said first and second electrodes, said at least a portion of at least one of said one or more semiconductors is disposed between said one of said first and second electrodes and said third and said another of said first and second electrodes, said another of said first and second electrodes includes a plurality of peripheral edges, said third electrode is disposed in said non-coplanar manner along at least a substantial portion of each of said plurality of peripheral edges thereby defining a pixel region, and said one of said first and second electrodes comprises said continuous electrode throughout said pixel region.

2. The apparatus of claim 1, further comprising one or more thin film transistors (TFTs) coupled to said MIS photodiode.

3. The apparatus of claim 2, wherein:
   at least one of said one or more TFTs includes a channel region having a thickness; and
   at least one of said one or more MIS photodiode semiconductor portions has a thickness greater than said at least one TFT channel region thickness.

4. The apparatus of claim 3, wherein said at least one of said one or more MIS photodiode semiconductor portions having a thickness greater than said at least one TFT channel region thickness comprises an at least substantially continuous layer of said semiconductor material.

5. The apparatus of claim 2, wherein at least one of said one or more TFTs is disposed at least substantially between said MIS photodiode and said substrate.

6. The apparatus of claim 1, wherein at least one of said one or more MIS photodiode semiconductor portions comprises n-type amorphous silicon (a-Si).

7. An apparatus including an integrated photosensitive device, comprising:
   a substrate; and
   a metal-insulator-semiconductor (MIS) photodiode at least a portion of which is disposed over said substrate and comprising
      a plurality of conduction layers including at least first, second and third conduction layers comprising first, second and third films of conductive material, respectively,
      one or more insulation layers at least a portion of at least one of which is disposed between said first and second conduction layers, wherein at least one of said one or more insulation layer portions comprises a respective at least substantially continuous film of insulation material, and
      one or more semiconductor layers at least a portion of at least one of which is disposed between one of said one or more insulation layers and one of said first and second conduction layers and is in planar contact with said one of said first and second conduction layers, wherein at least one of said one or more semiconductor layer portions comprises a respective at least substantially continuous film of semiconductor material, and said one of said first and second conduction layers comprises a continuous conduction layer,
      wherein another of said first and second conduction layers includes a perimeter, said third conduction layer is disposed, at least in part, in a non-coplanar manner along part of said perimeter, said third conduction layer is electrically insulated from said first and second conduction layers, said at least a portion of at least one of said one or more semiconductor layers is disposed between said one of said first and second conduction layers and said third and said another of said first and second conduction layers, said perimeter includes a plurality of peripheral edges, said third conduction layer is disposed in said non-coplanar manner along at least a substantial portion of each of said plurality of peripheral edges thereby defining a pixel region, and said one of said first and second conduction layers comprises said continuous conduction layer throughout said pixel region.

8. The apparatus of claim 7, further comprising one or more thin film transistors (TFTs) coupled to said MIS photodiode.

9. The apparatus of claim 8, wherein:
   at least one of said one or more TFTs includes a channel region having a thickness; and
   at least one of said one or more MIS photodiode semiconductor layer portions has a thickness greater than said at least one TFT channel region thickness.

10. The apparatus of claim 9, wherein said at least one of said one or more MIS photodiode semiconductor layer portions having a thickness greater than said at least one TFT channel region thickness comprises an at least substantially continuous film of said semiconductor material.

11. The apparatus of claim 8, wherein at least one of said one or more TFTs is disposed at least substantially between said MIS photodiode and said substrate.

12. The apparatus of claim 7, wherein at least one of said one or more MIS photodiode semiconductor layer portions comprises n-type amorphous silicon (a-Si).

13. An apparatus including an integrated photosensitive array, comprising:
a substrate; and
a plurality of metal-insulator-semiconductor (MIS) photodiodes at least a portion of which is disposed in an array over said substrate with each one of said at least a portion of said plurality of MIS photodiodes comprising
first and second electrodes,
one or more dielectrics at least a portion of at least one of which is disposed between said first and second electrodes, wherein at least one of said one or more dielectric portions comprises a respective at least substantially continuous layer of dielectric material,
one or more semiconductors at least a portion of at least one of which is disposed between one of said one or more dielectrics and one of said first and second electrodes and is in planar contact with said one of said first and second electrodes, wherein at least one of said one or more semiconductor portions comprises a respective at least substantially continuous layer of semiconductor material, and said one of said first and second electrodes comprises a continuous electrode, and
a third electrode a portion of which is disposed, at least in part, in a non-coplanar manner along a peripheral portion of another of said first and second electrodes, wherein said third electrode is electrically insulated from said first and second electrodes, said at least a portion of at least one of said one or more semiconductors is disposed between said one of said first and second electrodes and said third and said another of said first and second electrodes, said another of said first and second electrodes includes a plurality of peripheral edges, said third electrode is disposed in said non-coplanar manner along at least a substantial portion of each of said plurality of peripheral edges thereby defining a pixel region, and said one of said first and second electrodes comprises said continuous electrode throughout said pixel region.

14. The apparatus of claim 13, further comprising a plurality of thin film transistors (TFTs) coupled to said plurality of MIS photodiodes.

15. The apparatus of claim 14, wherein:
each one of at least a portion of said plurality of TFTs includes a respective channel region having a thickness; and
at least one of said one or more MIS photodiode semiconductor portions in each one of said plurality of MIS photodiodes has a thickness greater than a respective one of said plurality of TFT channel region thicknesses.

16. The apparatus of claim 15, wherein said at least one of said one or more MIS photodiode semiconductor portions in each one of said plurality of MIS photodiodes having a thickness greater than a respective one of said plurality of TFT channel region thicknesses comprises an at least substantially continuous layer of said semiconductor material.

17. The apparatus of claim 14, wherein each one of at least a portion of said plurality of TFTs is disposed at least substantially between a respective one of said at least a portion of said plurality of said MIS photodiodes and said substrate.

18. The apparatus of claim 13, wherein at least one of said one or more MIS photodiode semiconductor portions comprises n-type amorphous silicon (a-Si).

19. An apparatus including an integrated photosensitive device, comprising:
a substrate; and
a metal-insulator-semiconductor (MIS) photodiode at least a portion of which is disposed over said substrate and comprising
first and second electrodes,
one or more dielectrics at least a portion of at least one of which is disposed between said first and second electrodes, wherein at least one of said one or more dielectric portions comprises a respective at least substantially continuous layer of dielectric material,
one or more semiconductors at least a portion of at least one of which is disposed between one of said one or more dielectrics and one of said first and second electrodes and is in planar contact with said one of said first and second electrodes, wherein at least one of said one or more semiconductor portions comprises a respective at least substantially continuous layer of semiconductor material, and said one of said first and second electrodes comprises a continuous electrode, and
a third electrode substantially bordering one of said first and second electrodes with a portion of said third electrode disposed, at least in part, in a non-coplanar manner along a peripheral portion of another of said first and second electrodes, wherein said third electrode is electrically insulated from said first and second electrodes, said at least a portion of at least one of said one or more semiconductors is disposed between said one of said first and second electrodes and said third and said another of said first and second electrodes, said another of said first and second electrodes includes a plurality of peripheral edges, said third electrode is disposed in said non-coplanar manner along at least a substantial portion of each of said plurality of peripheral edges thereby defining a pixel region, and said one of said first and second electrodes comprises said continuous electrode throughout said pixel region.

20. An apparatus including an integrated photosensitive device, comprising:
a substrate; and
a metal-insulator-semiconductor (MIS) photodiode at least a portion of which is disposed over said substrate and comprising
first and second electrodes,
one or more dielectrics at least a portion of at least one of which is disposed between said first and second electrodes,
one or more semiconductors at least a portion of at least one of which is disposed between one of said one or more dielectrics and one of said first and second electrodes and is in planar contact with said one of said first and second electrodes, and said one of said first and second electrodes comprises a continuous electrode, and
a third electrode a portion of which is disposed, at least in part, in a non-coplanar manner along a peripheral portion of another of said first and second electrodes, wherein said third electrode is electrically insulated from said first and second electrodes, said at least a portion of at least one of said one or more semiconductors is disposed between said one of said first and second electrodes and said third and said another of said first and second electrodes, said another of said first and second electrodes includes a plurality of peripheral edges, said third electrode is disposed in said non-coplanar manner along at least a substantial portion of each of said plurality of peripheral edges thereby defining a pixel region, and said one of said first and second electrodes comprises said continuous electrode throughout said pixel region.

21. The apparatus of claim 20, further comprising one or more thin film transistors (TFTs) coupled to said MIS photodiode.

22. The apparatus of claim 21, wherein:
at least one of said one or more TFTs includes a channel region having a thickness; and
at least one of said one or more MIS photodiode semiconductor portions has a thickness greater than said at least one TFT channel region thickness.

23. The apparatus of claim 21, wherein at least one of said one or more TFTs is disposed at least substantially between said MIS photodiode and said substrate.

24. The apparatus of claim 20, wherein at least one of said one or more MIS photodiode semiconductor portions comprises n-type amorphous silicon (a-Si).

25. An apparatus including an integrated photosensitive device, comprising:
a substrate; and
a metal-insulator-semiconductor (MIS) photodiode at least a portion of which is disposed over said substrate and comprising
a plurality of conduction layers including at least first, second and third conduction layers comprising first, second and third films of conductive material, respectively,
one or more insulation layers at least a portion of at least one of which is disposed between said first and second conduction layers, and
one or more semiconductor layers at least a portion of at least one of which is disposed between one of said one or more insulation layers and one of said first and second conduction layers and is in planar contact with said one of said first and second conduction layers, and said one of said first and second conduction layers comprises a continuous conduction layer,
wherein another of said first and second conduction layers includes a perimeter, said third conduction layer is disposed, at least in part, in a non-coplanar manner along part of said perimeter, said third conduction layer is electrically insulated from said first and second conduction layers, said at least a portion of at least one of said one or more semiconductor layers is disposed between said one of said first and second conduction layers and said third and said another of said first and second conduction layers, said perimeter includes a plurality of peripheral edges, said third conduction layer is disposed in said non-coplanar manner along at least a substantial portion of each of said plurality of peripheral edges thereby defining a pixel region, and said one of said first and second conduction layers comprises said continuous conduction layer throughout said pixel region.

26. The apparatus of claim 25, further comprising one or more thin film transistors (TFTs) coupled to said MIS photodiode.

27. The apparatus of claim 26, wherein:
at least one of said one or more TFTs includes a channel region having a thickness; and
at least one of said one or more MIS photodiode semiconductor layer portions has a thickness greater than said at least one TFT channel region thickness.

28. The apparatus of claim 26, wherein at least one of said one or more TFTs is disposed at least substantially between said MIS photodiode and said substrate.

29. The apparatus of claim 25, wherein at least one of said one or more MIS photodiode semiconductor layer portions comprises n-type amorphous silicon (a-Si).

30. An apparatus including an integrated photosensitive array, comprising:
a substrate; and
a plurality of metal-insulator-semiconductor (MIS) photodiodes at least a portion of which is disposed in an array over said substrate with each one of said at least a portion of said plurality of MIS photodiodes comprising
first and second electrodes,
one or more dielectrics at least a portion of at least one of which is disposed between said first and second electrodes,
one or more semiconductors at least a portion of at least one of which is disposed between one of said one or more dielectrics and one of said first and second electrodes and is in planar contact with said one of said first and second electrodes, and said one of said first and second electrodes comprises a continuous electrode, and
a third electrode a portion of which is disposed, at least in part, in a non-coplanar manner along a peripheral portion of another of said first and second electrodes, wherein said third electrode is electrically insulated from said first and second electrodes, said at least a portion of at least one of said one or more semiconductors is disposed between said one of said first and second electrodes and said third and said another of said first and second electrodes, said another of said first and second electrodes includes a plurality of peripheral edges, said third electrode is disposed in said non-coplanar manner along at least a substantial portion of each of said plurality of peripheral edges thereby defining a pixel region, and said one of said first and second electrodes comprises said continuous electrode throughout said pixel region.

31. The apparatus of claim 30, further comprising a plurality of thin film transistors (TFTs) coupled to said plurality of MIS photodiodes.

32. The apparatus of claim 31, wherein:
each one of at least a portion of said plurality of TFTs includes a respective channel region having a thickness; and
at least one of said one or more MIS photodiode semiconductor portions in each one of said plurality of MIS photodiodes has a thickness greater than a respective one of said plurality of TFT channel region thicknesses.

33. The apparatus of claim 31, wherein each one of at least a portion of said plurality of TFTs is disposed at least substantially between a respective one of said at least a portion of said plurality of said MIS photodiodes and said substrate.

34. The apparatus of claim 30, wherein at least one of said one or more MIS photodiode semiconductor portions comprises n-type amorphous silicon (a-Si).

* * * * *